US012772778B2

(12) United States Patent
Jang et al.

(10) Patent No.: US 12,772,778 B2
(45) Date of Patent: Oct. 20, 2026

(54) SUBSTRATE BONDING APPARATUS AND METHOD OF MANUFACTURING SEMICONDUCTOR DEVICE USING THE SAME

(71) Applicant: Samsung Electronics Co., Ltd., Suwon-si (KR)

(72) Inventors: Sehoon Jang, Suwon-si (KR); Inhwa Baek, Suwon-si (KR); Hyungku Kim, Suwon-si (KR); Kibum Yu, Suwon-si (KR); Jaesung Yun, Suwon-si (KR); Yongin Lee, Suwon-si (KR); Jaehyuk Jung, Suwon-si (KR); Gwanghee Jo, Suwon-si (KR); Youngjin Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 328 days.

(21) Appl. No.: 18/415,798

(22) Filed: Jan. 18, 2024

(65) Prior Publication Data

US 2024/0242981 A1 Jul. 18, 2024

(30) Foreign Application Priority Data

Jan. 18, 2023 (KR) ........................ 10-2023-0007460

(51) Int. Cl.
*H10P 72/00* (2026.01)
*H10W 80/00* (2026.01)

(52) U.S. Cl.
CPC ....... *H10P 72/0428* (2026.01); *H10W 80/301* (2026.01)

(58) Field of Classification Search
CPC .. H10P 72/0428; H10P 72/7611; H10P 72/78; H10P 10/12; H10P 72/7624; H10W 80/301; H10W 99/00
See application file for complete search history.

(56) References Cited

U.S. PATENT DOCUMENTS 5,661,316 A 8/1997 Kish, Jr. et al.
8,268,699 B2 9/2012 Park et al.
(Continued)

FOREIGN PATENT DOCUMENTS

KR 10-2009-0106822 A 10/2009
KR 10-2021-0023298 A 3/2021

OTHER PUBLICATIONS

Korean Office Action dated Jun. 21, 2026 for corresponding Korean Patent Application No. 10-2023-0007460 and its English-language translation.

*Primary Examiner* — S M Sohel Imtiaz
(74) *Attorney, Agent, or Firm* — Harness, Dickey & Pierce, P.L.C.

(57) ABSTRACT

A substrate bonding apparatus may include a first bonding chuck including a first base and a first transformation plate, and a second including a second base facing the first bonding chuck. The first base may include a recess groove. The recess groove may be recessed inward from a surface on which the first transformation plate is mounted. The first transformation plate may include a first protrusion protruding outward from a first surface of the first transformation plate. A second surface of the first transformation plate may be opposite the first surface of the first transformation plate. The second surface of the first transformation plate may be configured to support a first substrate. The first transformation plate may be mounted on the first base in a manner allowing a distance between the first transformation plate and the first base to vary.

18 Claims, 20 Drawing Sheets

(56) References Cited

U.S. PATENT DOCUMENTS

| | | | |
|---|---|---|---|
| 8,822,307 | B2 | 9/2014 | Yamaguchi et al. |
| 9,627,243 | B2 | 4/2017 | Liu et al. |
| 9,741,595 | B2 | 8/2017 | Sugakawa et al. |
| 9,754,813 | B2 | 9/2017 | Huang et al. |
| 9,837,291 | B2 | 12/2017 | Huang et al. |
| 10,049,901 | B2 | 8/2018 | Liu et al. |
| 10,279,575 | B2 | 5/2019 | Wagenleitner et al. |
| 10,410,892 | B2 | 9/2019 | Lu et al. |
| 10,438,918 | B2 | 10/2019 | Omori et al. |
| 10,580,752 | B2 | 3/2020 | Yamauchi |
| 10,923,452 | B2 | 2/2021 | Han et al. |
| 11,315,901 | B2 | 4/2022 | Zinner et al. |
| 2015/0210057 | A1* | 7/2015 | Wagenleithner ...... B32B 37/003 |
| 2015/0214082 | A1* | 7/2015 | Huang .................. H10P 10/128<br>438/457 |
| 2016/0155721 | A1* | 6/2016 | Sugakawa ........... H10P 72/0428<br>438/5 |
| 2017/0053823 | A1* | 2/2017 | Huang ................ B32B 37/1018 |
| 2017/0140955 | A1* | 5/2017 | Liu ....................... B23B 31/305 |
| 2017/0221856 | A1* | 8/2017 | Yamauchi ............ B23K 20/023 |
| 2018/0144999 | A1* | 5/2018 | Lu ....................... H10P 72/0616 |
| 2020/0373274 | A1* | 11/2020 | Han ........................ H10P 10/12 |
| 2021/0057263 | A1* | 2/2021 | Kim .................... H10P 72/0428 |
| 2021/0104405 | A1* | 4/2021 | Kim ....................... B23K 20/10 |
| 2021/0143026 | A1* | 5/2021 | Jeon ...................... B32B 37/003 |

* cited by examiner

SUBSTRATE BONDING APPARATUS AND METHOD OF MANUFACTURING SEMICONDUCTOR DEVICE USING THE SAME

CROSS-REFERENCE TO RELATED APPLICATION

This application is based on and claims priority under 35 U.S.C. § 119 to Korean Patent Application No. 10-2023-0007460, filed on Jan. 18, 2023, in the Korean Intellectual Property Office, the disclosure of which is incorporated by reference herein in its entirety.

BACKGROUND

Inventive concepts relate to a substrate bonding apparatus and/or a method of manufacturing a semiconductor element using the substrate bonding apparatus, and more particularly, to a substrate bonding apparatus capable of improving reliability of a bonding process of substrates and/or a method of manufacturing a semiconductor element using the substrate bonding apparatus.

During a manufacturing process of a semiconductor device, a substrate bonding process for bonding two or more substrates to each other may be performed. Such substrate bonding process may be carried out to improve the packaging density of semiconductor chips in a semiconductor device. For example, a semiconductor module having a stacked structure of semiconductor chips may not only have high packaging density of semiconductor chips but also may have advantages in reducing wire length among the semiconductor chips and processing high-speed signals. When manufacturing a semiconductor module having a stacked structure of semiconductor chips, instead of bonding semiconductor chips, bonding wafers first and then cutting the bonded wafers into stacked semiconductor chips may improve productivity. The substrate bonding process may be performed by a wafer-to-wafer method in which two wafers are directly bonded to each other without using an additional medium. In general, the wafer-to-wafer method is carried out by using a bonding apparatus including a bonding chuck supporting wafers and a component configured to press the wafers.

SUMMARY

Inventive concepts provide a substrate bonding apparatus capable of improving reliability of bonding processes and/or a method of manufacturing a semiconductor device using the substrate bonding apparatus.

Inventive concepts provide a substrate bonding apparatus capable of suppressing permanent physical transformation of a substrate and/or a method of manufacturing a semiconductor device using the substrate bonding apparatus.

Aspects and features of inventive concepts are not limited to the foregoing, and other aspects and features may be clearly understood by a person skilled in the art from the description below.

According to an embodiment of inventive concepts, a substrate bonding apparatus may include a first bonding chuck configured to support a first substrate, the first bonding chuck including a first base and a first transformation plate; and a second bonding chuck configured to support a second substrate, the second bonding chuck including a second base facing the first bonding chuck. The first base may include a recess groove. The recess groove may be recessed inward from a surface of the first base on which the first transformation plate is mounted. The first transformation plate may include a first protrusion protruding outward from a first surface of the first transformation plate. A second surface of the first transformation plate may be opposite the first surface of the first transformation plate. The second surface of the first transformation plate may be configured to support the first substrate. The first transformation plate may be mounted on the first base in a manner allowing a distance between the first transformation plate and the first base to vary.

According to an embodiment of inventive concepts, a substrate bonding apparatus may include a first bonding chuck configured to support a first substrate, the first bonding chuck including a first base, a first transformation plate, and a pressure rod; and a second bonding chuck facing the first bonding chuck, the second bonding chuck configured to support a second substrate. The first base may include a recess groove. The recess groove may be recessed inward from a surface of the first base. The first transformation plate may be mounted on the surface of the first base. The first transformation plate may include a first surface in contact with the first base in a manner allowing a distance between the first transformation plate and the first base to vary. A second surface of the first transformation plate may be opposite the first surface of the first transformation plate. The second surface of the first transformation plate may be configured to support the first substrate. A center of the first transformation plate may include a through hole extending from the first surface of the first transformation plate to the second surface of the first transformation plate. The pressure rod may be mounted on the first base and configured to move in a vertical direction through the through hole of the first base and may physically press and transform the first substrate when the first substrate is on the second surface of the first transformation plate. The first transformation plate may include a plurality of areas having different thicknesses from each other.

According to an embodiment of inventive concepts, a method of manufacturing a semiconductor device may include mounting a first substrate on a first transformation plate of a first bonding chuck, the mounting the first substrate including mounting the first substrate on a surface of the first transformation plate facing the first substrate, the surface of the first transformation plate including a protrusion; mounting a second substrate on a second transformation plate of a second bonding chuck; aligning the first bonding chuck on the second bonding chuck; transforming the first substrate by transforming the first transformation plate to provide a transformed first substrate; and bonding the transformed first substrate and the second substrate to each other.

BRIEF DESCRIPTION OF THE DRAWINGS

Embodiments will be more clearly understood from the following detailed description taken in conjunction with the accompanying drawings in which.

DETAILED DESCRIPTION

Example embodiments will now be described more fully with reference to the accompanying drawings, in which some example embodiments are shown. Example embodiments, may however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art.

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Figure 1:
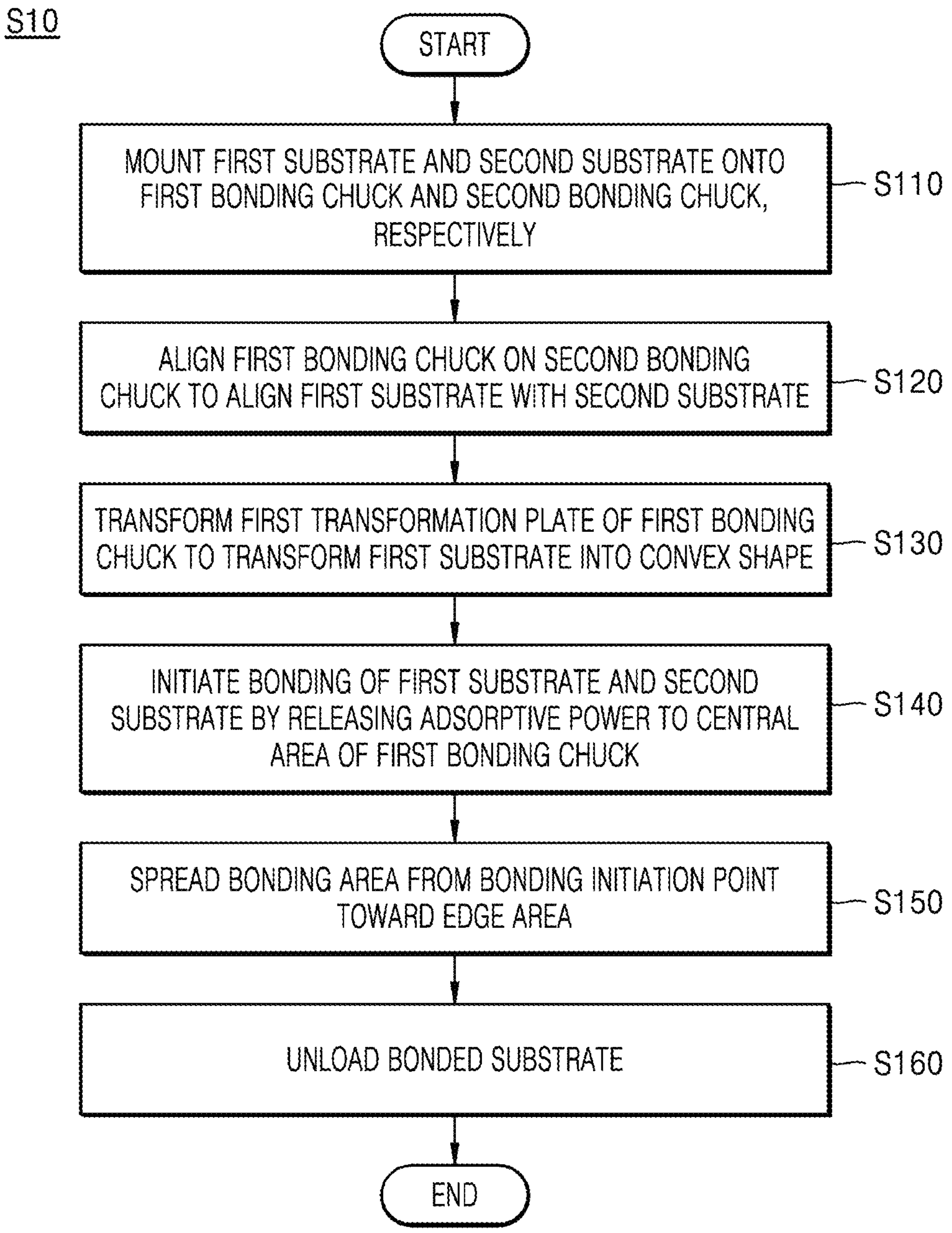
FIG. 1 is a flowchart illustrating a substrate bonding method according to some embodiments.

FIG. 1 is a flowchart illustrating a substrate bonding method according to some embodiments. FIGS. 2A to 2D are cross-sectional diagrams illustrating in order a substrate bonding method using a substrate bonding apparatus according to some embodiments. FIG. 2E is a schematic bottom view diagram of a first transformation plate of FIG. 2A.

A substrate bonding apparatus 10 is first described with reference to FIGS. 2A and 2E, and then a substrate bonding method S10 is described with reference to FIGS. 2A to 2D.

Figure 2A:
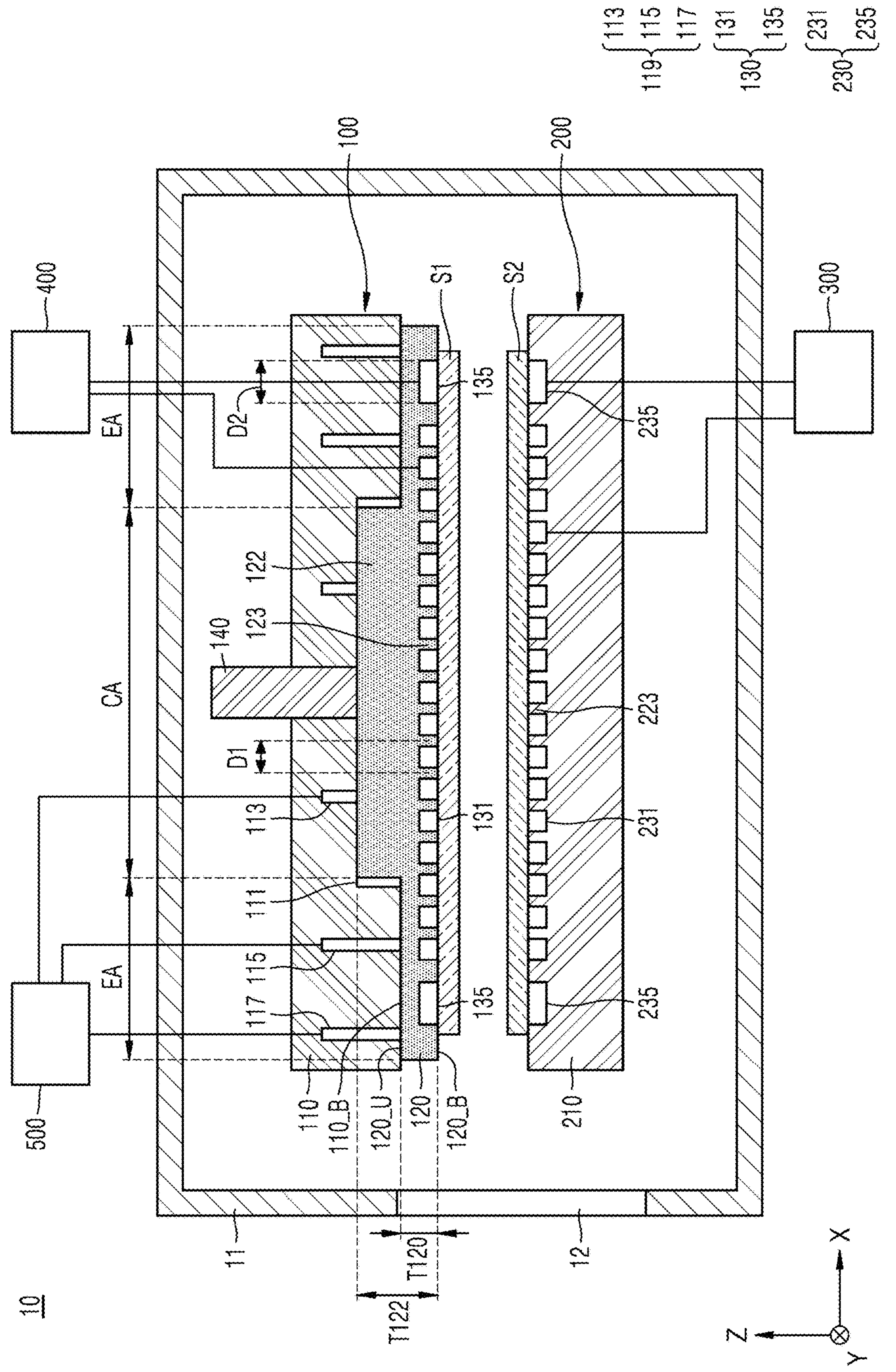
FIGS. 2A to 2D are cross-sectional diagrams illustrating in order a substrate bonding method using a substrate bonding apparatus according to some embodiments.
Figure 2B:
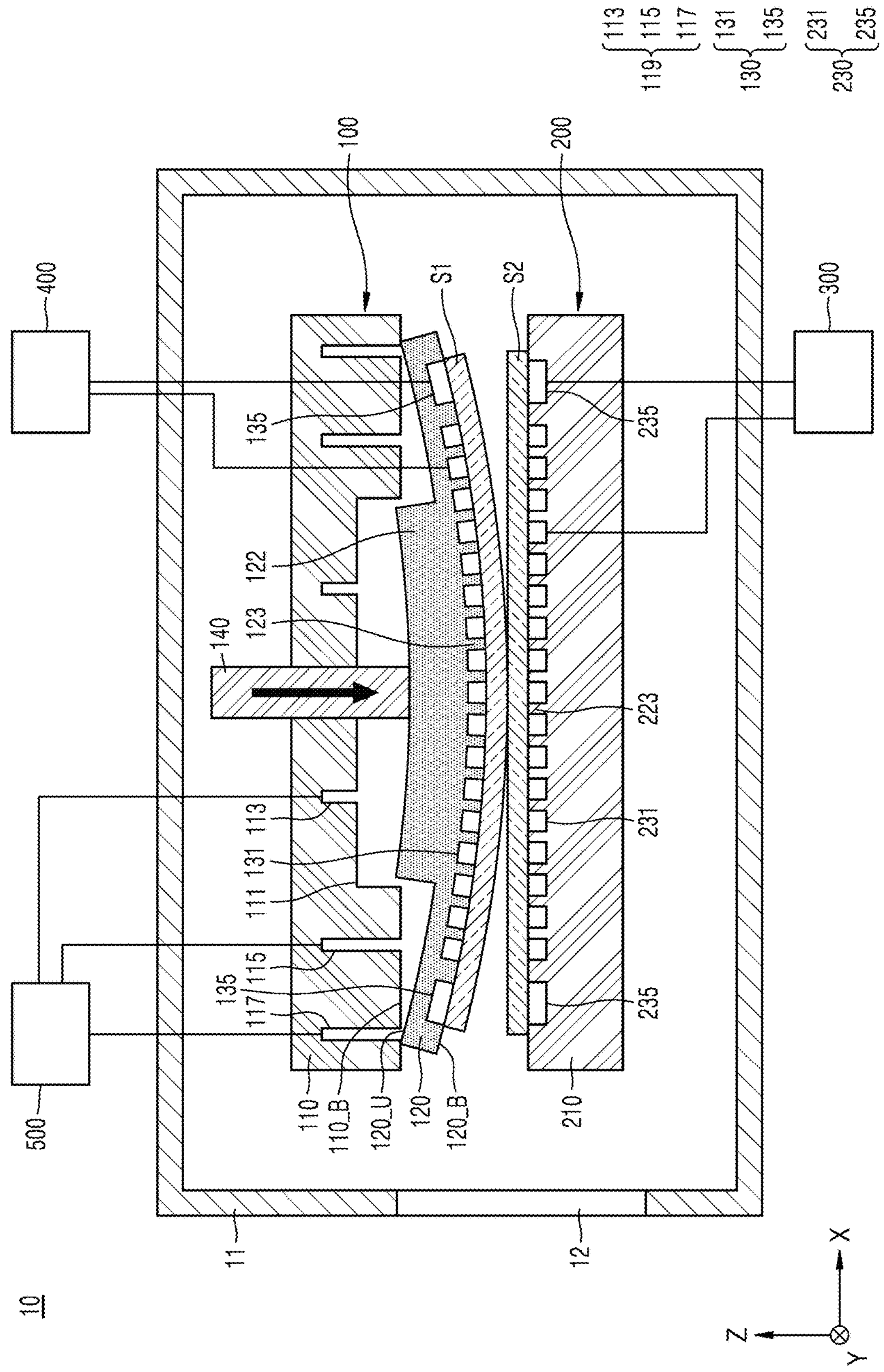
Figure 2C:
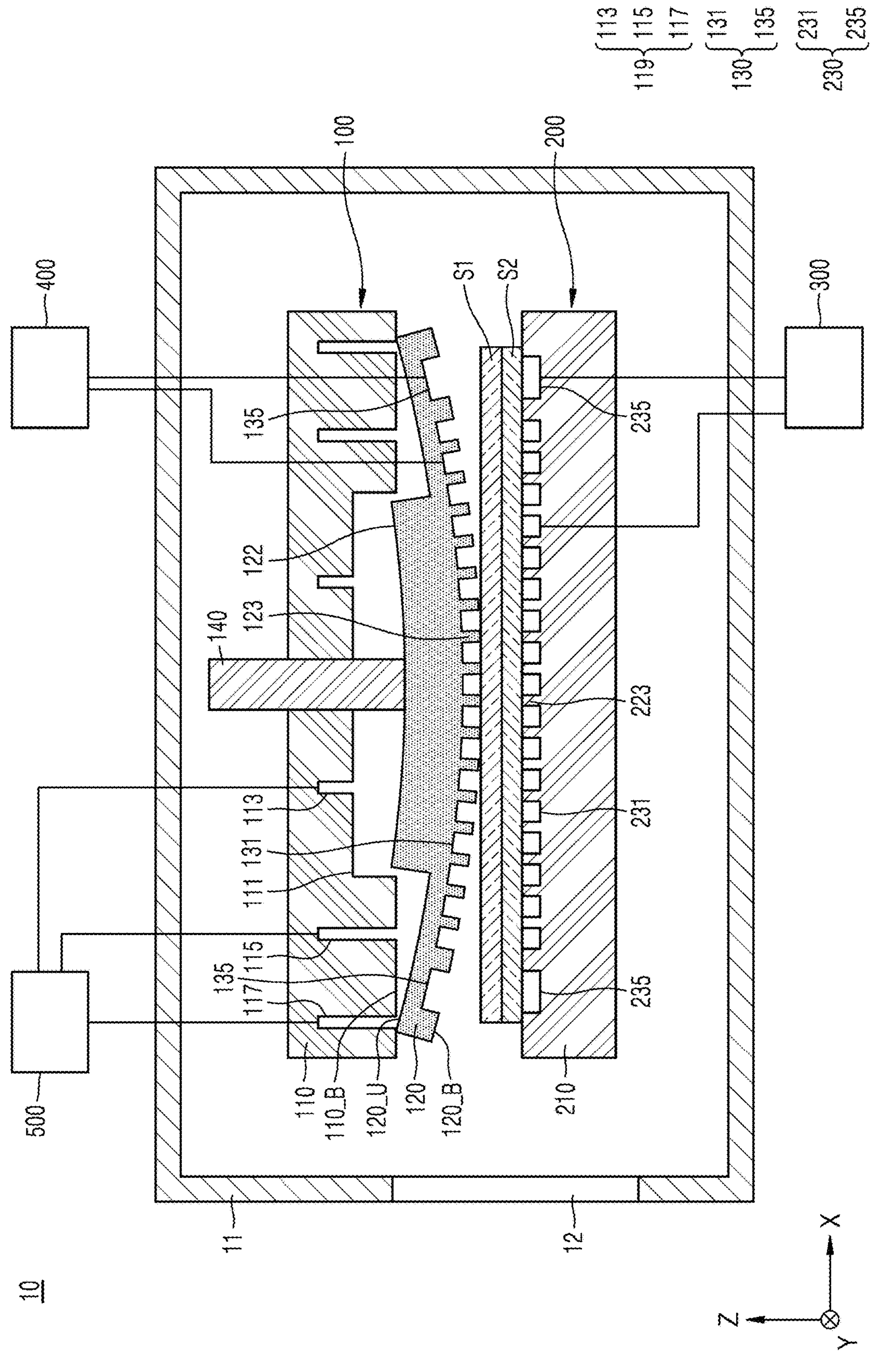
Figure 2D:
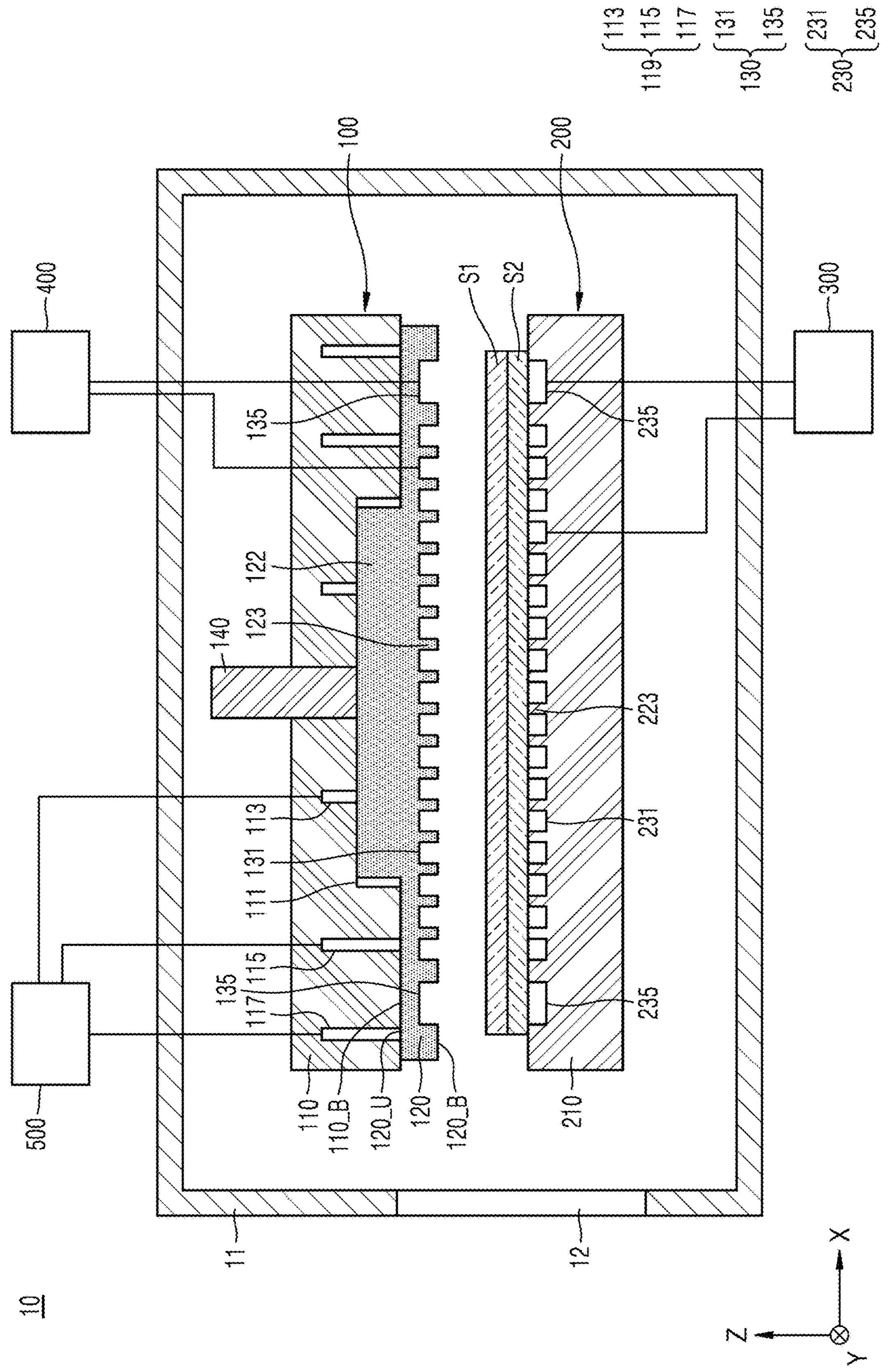
Figure 2E:
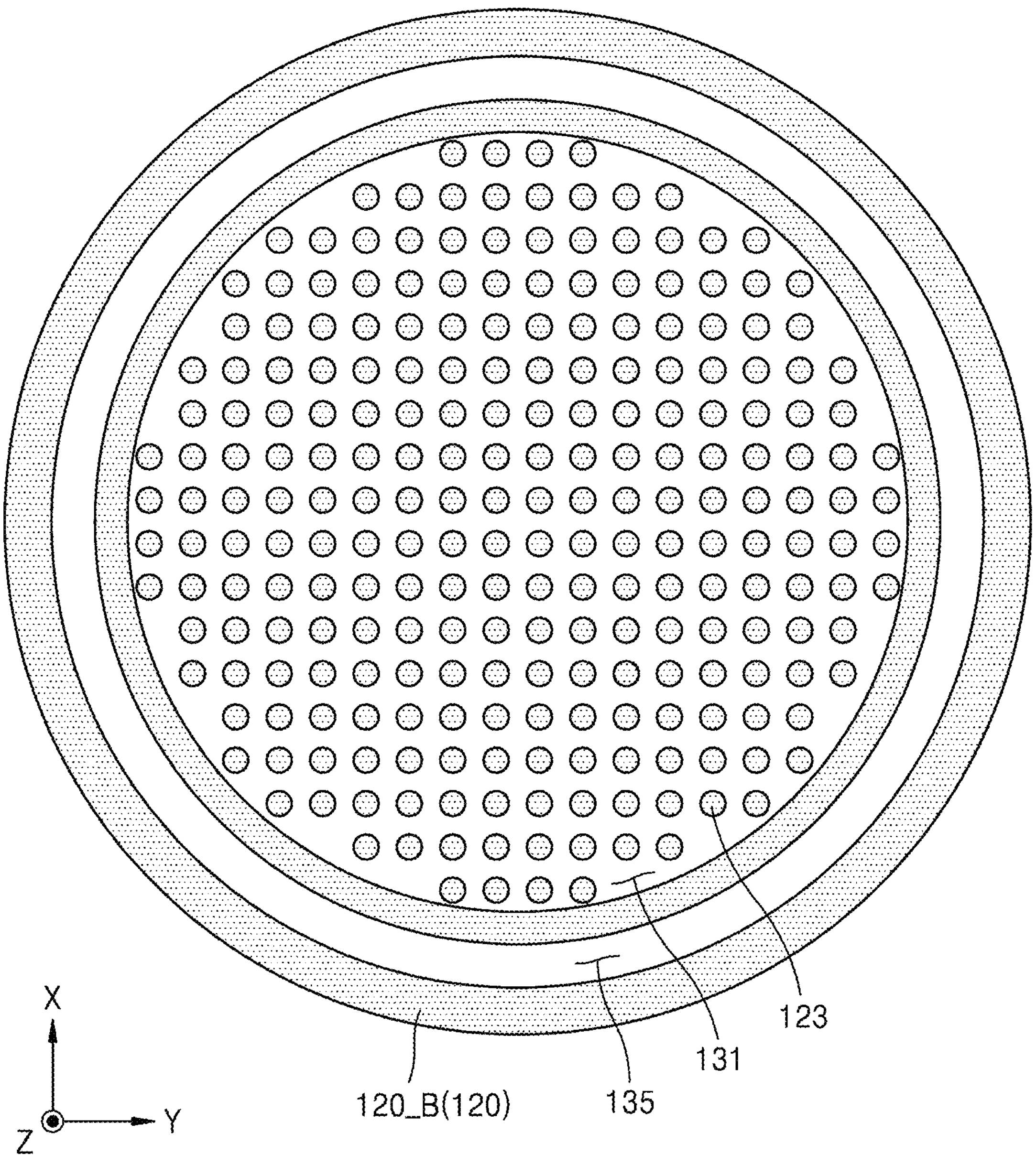
FIG. 2E is a schematic bottom view diagram of a first transformation plate of FIG. 2A.

With reference to FIGS. 2A and 2E, the substrate bonding apparatus 10 may include a chamber 11, a first bonding chuck 100, and a second bonding chuck 200.

The chamber 11 of the substrate bonding apparatus 10 may accommodate the first bonding chuck 100 and the second bonding chuck 200. That is, the chamber 11 may surround the first bonding chuck 100 and the second bonding chuck 200.

The chamber 11 may provide an interior space for performance of a bonding process between a first substrate S1 and a second substrate S2. In some embodiments, vacuum pressure or atmospheric pressure may be formed in the interior space of the chamber 11. The chamber 11 may include an opening 12. The first substrate S1 and the second substrate S2 may be brought into or out of the interior space of the chamber 11 through the opening 12 of the chamber 11. To protect the interior space of the chamber 11 from the external environment, the opening 12 may be closed or sealed when necessary.

The first bonding chuck 100 of the substrate bonding apparatus 10 may support the first substrate S1.

The first bonding chuck 100 may support the first substrate S1 through a plurality of first vacuum grooves 130. The plurality of first vacuum grooves 130 may provide adsorptive power between the first bonding chuck 100 and the first substrate S1. The first bonding chuck 100 may include an external force generator 400 configured to form adsorptive power to the plurality of first vacuum grooves 130.

In some embodiments, the first bonding chuck 100 may fix or support the first substrate S1 through vacuum pressure, electrostatic force, or external force by Bernoulli's theorem. In some embodiment, the first bonding chuck 100 may fix the first substrate S1 by using vacuum pressure. The plurality of first vacuum grooves 130 may be at positions on which the first substrate S1 settles. The external force generator 400 may be a vacuum pump capable of applying vacuum pressure to the plurality of first vacuum grooves 130. When vacuum pressure is formed at the plurality of first vacuum grooves 130 by the external force generator 400, the first substrate S1 may be vacuum-adsorbed onto the first bonding chuck 100.

Alternatively, in other embodiments, the first bonding chuck 100 may support the first substrate S1 by using electrostatic force. The first bonding chuck 100 may include a plurality of electrodes instead of the plurality of first vacuum grooves 130. The plurality of electrodes may be arranged at positions on which the first substrate S1 settles and may generate electrostatic force. The external force generator 400 may be a power supply (e.g., power supply circuit) forming electrostatic force to the plurality of electrodes. When electrostatic force is generated to the plurality of electrodes by the external force generator 400, the first substrate S1 may be adsorbed to the first bonding chuck 100.

Alternatively, in other embodiments, the first bonding chuck 100 may support the first substrate S1 by using principles of Bernoulli's theorem. The first bonding chuck 100 may include a plurality of holes instead of the plurality of first vacuum grooves 130. The plurality of holes may discharge or draw fluid. The external force generator 400 may be a pump which provides fluid to the plurality of holes or draws fluid from the plurality of holes.

According to Bernoulli's theorem, an area in which fluid moves relatively faster than in peripheral areas has relatively low pressure, compared to the peripheral areas. That is, due to relatively fast air speed formed by the plurality of holes, relatively low pressure may be formed between the first substrate S1 and the first bonding chuck 100. By the low pressure formed between the first substrate S1 and the first bonding chuck 100, the first substrate S1 may be adsorbed onto the first bonding chuck 100.

The second bonding chuck 200 may face the first bonding chuck 100 and support the second substrate S2.

The second bonding chuck 200 may include a plurality of second vacuum grooves 230. The plurality of second vacuum grooves 230 may be arranged in a surface of a second base 210 of the second bonding chuck 200, which faces the second substrate S2.

The second bonding chuck 200 may support the second substrate S2 through the plurality of second vacuum grooves 230. The plurality of second vacuum grooves 230 may provide adsorptive power between the second bonding chuck 200 and the second substrate S2. The second bonding chuck 200 may include an external force generator 300 configured to form adsorptive power to the plurality of second vacuum grooves 230.

In some embodiments, the second bonding chuck 200 may fix or support the second substrate S2 through vacuum pressure, electrostatic force, or external force by principles of Bernoulli's theorem.

In some embodiments, the second bonding chuck 200 may fix the second substrate S2 by using vacuum pressure. For example, the plurality of second vacuum grooves 230 may be at positions on which the second substrate S2 settles. The external force generator 300 may be a vacuum pump capable of applying vacuum pressure to the plurality of second vacuum grooves 230.

Alternatively, in other embodiments, the second bonding chuck 200 may support the second substrate S2 by using electrostatic force. The second bonding chuck 200 may include a plurality of electrodes instead of the plurality of second vacuum grooves 230. The plurality of electrodes may be arranged at positions on which the second substrate S2 settles and may generate electrostatic force. The external force generator 300 may be a power supply forming electrostatic force to the plurality of electrodes.

Alternatively, in other embodiments, the second bonding chuck 200 may support the second substrate S2 by using principles of Bernoulli's theorem. The second bonding chuck 200 may include a plurality of holes instead of the plurality of second vacuum grooves 230. The plurality of holes may discharge or draw fluid. The external force generator 300 may be a pump which provides fluid to the plurality of holes or draws fluid from the plurality of holes.

The plurality of second vacuum grooves 230 of the second bonding chuck 200 may include an inner vacuum groove 231 and an edge vacuum groove 235 in the second base 210. The external force generator 300 may adjust the inner vacuum groove 231 and the edge vacuum groove 235 separately.

In some embodiments, the plurality of second vacuum grooves 230 may be respectively aligned with the plurality of first vacuum grooves 130. For example, when the bonding between the first substrate S1 and the second substrate S2 spreads, the plurality of first vacuum grooves 130 may be respectively aligned with the plurality of second vacuum grooves 230. However, inventive concepts are not limited thereto, and the plurality of first vacuum grooves 130 may be respectively misaligned with the plurality of second vacuum grooves 230.

In some embodiments, a shape of the plurality of second vacuum grooves 230 may correspond to a shape of the plurality of first vacuum grooves 130. In other words, the plurality of second vacuum grooves 230 and the plurality of first vacuum grooves 130 may have substantially the same shape. That is, a width of each of the plurality of first vacuum grooves 130 may be identical to a width of each of the plurality of second vacuum grooves 230, and a thickness of each of the plurality of first vacuum grooves 130 may be identical to a thickness of each of the plurality of second vacuum grooves 230.

In some embodiments, the second bonding chuck 200 may include a plurality of dimples 223. The plurality of dimples 223 may be arranged in the second base 210. The plurality of dimples 223 may be arranged between the inner vacuum groove 231 of the second base 210. The plurality of dimples 223 may be evenly arranged in the inner vacuum groove 231.

The plurality of dimples 223 may be in contact with the second substrate S2. That is, when the inner vacuum groove 231 adsorbs the second substrate S2, the second substrate S2 may be in contact with the plurality of dimples 223. That is, the plurality of dimples 223 may limit and/or prevent transformation of the second substrate S2 due to the adsorptive power formed at the inner vacuum groove 231.

In some embodiments, the plurality of dimples 223 may be arranged apart from each other. Vacuum pressure may be formed between the plurality of dimples 223 arranged in the inner vacuum groove 231. Accordingly, the second substrate S2 may receive adsorptive power from the spaces between the plurality of dimples 223.

The first bonding chuck 100 may be an upper bonding chuck and the second bonding chuck 200 may be a lower bonding chuck arranged below the first bonding chuck 100. However, inventive concepts are not limited thereto, and the first bonding chuck 100 may be a lower bonding chuck and the second bonding chuck 200 may be an upper bonding chuck arranged above the first bonding chuck 100.

From this point, the first bonding chuck 100 is further described in detail. The first bonding chuck 100 may include a first base 110, a first transformation plate 120 mounted onto the first base 110, and the external force generator 400. In some embodiments, the first bonding chuck 100 may include a push rod 140.

The first transformation plate 120 may be mounted on a surface 110_B of the first base 110. The first transformation plate 120 may be mounted onto the first base 110 through a plurality of vacuum lines 119. That is, the plurality of vacuum lines 119 may provide adsorptive power between the first base 110 and the first transformation plate 120. In other words, the plurality of vacuum lines 119 may provide adsorptive power to support the first transformation plate 120 on the surface 110_B of the first base 110, which is in contact with the first transformation plate 120.

In some embodiments, the plurality of vacuum lines 119 may include a center vacuum line 113, a middle vacuum line 115, and an edge vacuum line 117. The center vacuum line 113 may be located at the center of the first base 110, the edge vacuum line 117 may be located at an edge of the first base 110, and the middle vacuum line 115 may be located between the center vacuum line 113 and the edge vacuum line 117.

In some embodiments, the plurality of vacuum lines 119 may each have a ring shape. In other words, when the plurality of vacuum lines 119 face the surface 110_B of the first base 110, the plurality of vacuum lines 119 may each have a ring shape and spaced apart from each other.

Although FIG. 2A illustrates one center vacuum line 113, one middle vacuum line 115, and one edge vacuum line 117, the number of vacuum lines 119 is not limited thereto.

In some embodiments, at least some of the plurality of vacuum lines 119 may be located on a recess groove 111. For example, the center vacuum line 113 may be located on the recess groove 111. In other words, at least some of the plurality of vacuum lines 119 may face a first protrusion 122.

The first bonding chuck 100 may further include an external force generator 500 configured to form adsorptive power to the plurality of vacuum lines 119. The external force generator 500 may adjust the center vacuum line 113, the middle vacuum line 115, and the edge vacuum line 117 separately. In other words, the external force generator 500 may adjust the adsorptive power of the plurality of vacuum lines 119 separately. In some embodiments, the external force generator 500 may be a vacuum pump.

The first transformation plate 120 may include the first protrusion 122 on a first surface 120_U of the first transformation plate 120. The first transformation plate 120 may include the first protrusion 122 on a surface facing the first base 110. That is, the first transformation plate 120 may include the first protrusion 122 protruding outward from the first surface 120_U of the first transformation plate 120.

In some embodiments, the first protrusion 122 may be located in a central area CA of the first transformation plate 120. The central area CA of the first transformation plate 120 may be surrounded by an edge area EA of the first transformation plate 120.

That is, a thickness of the edge area EA of the first transformation plate 120 may be a first thickness T120, and a thickness of the central area CA of the first transformation plate 120 may be a second thickness T122. The second thickness T122 may be greater than the first thickness T120.

In some embodiments, the central area CA may be a circular area having a radius of about 80 mm to about 120 mm from a central point of the first surface 120_U of the first transformation plate 120. In some embodiments, the second thickness T122 of the central area CA of the first transformation plate 120 may be about 2 mm to about 5 mm. In some embodiments, the second thickness T122 may be greater than the first thickness T120 by about 1 mm to about 2 mm.

In some embodiments, the first base 110 may include the recess groove 111. The recess groove 111 may have a shape recessed inward from a contact surface of the first base 110 and the first transformation plate 120. In some embodiments, the recess groove 111 may have a shape recessed inward from the surface 110_B of the first base 110.

The recess groove 111 may correspond to the first protrusion 122. That is, the first protrusion 122 may be inserted into the recess groove 111. In other words, the shape of the interior space of the recess groove 111 may be substantially identical to the shape of the first protrusion 122. That is, the recess groove 111 may correspond to the first protrusion 122.

For example, as the shape of the first transformation plate 120 changes, the first protrusion 122 may be inserted into or separated from the recess groove 111.

The first transformation plate 120 may include the plurality of first vacuum grooves 130 where adsorptive power may be formed. The external force generator 400 may apply adsorptive power to the plurality of first vacuum grooves 130 such that the first substrate S1 is adsorbed onto a second surface 120_B of the first transformation plate 120, or may release the adsorptive power of the plurality of first vacuum grooves 130 such that the adsorption of the first substrate S1 is released.

The plurality of first vacuum grooves 130 may include an inner vacuum groove 131 and an edge vacuum groove 135 arranged in the second surface 120_B of the first transformation plate 120. The external force generator 400 may adjust the adsorptive power formed at the inner vacuum groove 131 and the edge vacuum groove 135 separately.

In some embodiments, the inner vacuum groove 131 may be located in the central area CA of the second surface 120_B of the first transformation plate 120, and the edge vacuum groove 135 may be located in the edge area EA of the first transformation plate 120. In other words, the edge vacuum groove 135 may be located farther from the center of the second surface 120_B of the first transformation plate 120 than the inner vacuum groove 131.

For example, as shown in FIG. 2E, the edge vacuum groove 135 may surround the inner vacuum groove 131. In some embodiments, the inner vacuum groove 131 may have a circular shape, and the edge vacuum groove 135 may have a ring shape surrounding the inner vacuum groove 131. For example, the ring shape of the edge vacuum groove 135 may be a circular shape and surround the circular shape of the inner vacuum groove 131 or the ring shape of the edge vacuum groove 135 may be an oval shape and surround the circular shape of the inner vacuum groove 131, but example embodiments are not limited thereto.

In some embodiments, the first transformation plate 120 may include a plurality of dimples 123. The plurality of dimples 123 may be located on a second surface 120_B of a first transformation plate 120. The plurality of dimples 123 may be located between the inner vacuum grooves 131. The plurality of dimples 123 may be evenly arranged between the inner vacuum grooves 131.

The plurality of dimples 123 may be in contact with the first substrate S1. That is, when the inner vacuum groove 131 adsorbs the first substrate S1, the first substrate S1 may be in contact with the plurality of dimples 123. That is, the plurality of dimples 123 may limit and/or prevent transformation of the first substrate S1 due to the adsorptive power formed at the inner vacuum groove 131.

In some embodiments, the plurality of dimples 123 may be arranged apart from each other. Vacuum pressure may be formed between the plurality of dimples 123 arranged between the inner vacuum grooves 131. Accordingly, the first substrate S1 may receive adsorptive power from the spaces between the plurality of dimples 123.

A distance between spaced dimples 123 may be less than a width of the edge vacuum groove 135. When the distance between the spaced dimples 123 is a first distance D1 and the width of the edge vacuum groove 135 is a second distance D2, the first distance D1 may be less than the second distance D2. In some embodiments, the first distance D1 may be about 1 mm to about 2 mm and the second distance D2 may be about 2 mm to about 3 mm.

In the central area of the first substrate S1, the spaces between the dimples 123 may receive the adsorptive power, and in the edge area of the first substrate S1, the width of the edge vacuum groove 135 may receive the adsorptive power. As a size of each of the spaces between the plurality of dimples 123 is less than the width of the edge vacuum groove 135, permanent transformation in the central area of the first substrate S1 may be suppressed.

In some embodiments, the external force generator 400 may adjust the adsorptive power applied to the inner vacuum groove 131 and the edge vacuum groove 135 separately. For example, when a bonding area between the first substrate S1 and the second substrate S2 increases, the external force generator 400 may remove the adsorptive power sequentially from the inner vacuum groove 131 to the edge vacuum groove 135. That is, the external force generator 400 may gradually release the adsorption of the first substrate S1 and the first transformation plate 120 in a direction from the central area CA of the second surface 120_B of the first transformation plate 120 towards the edge area EA of the second surface 120_B.

In some embodiments, the plurality of first vacuum grooves 130 may further include a middle vacuum groove (not shown). The middle vacuum groove may be located between the inner vacuum groove 131 and the edge vacuum groove 135. The adsorptive power of the inner vacuum groove 131, the middle vacuum groove, and the edge vacuum groove 135 may be adjusted independently.

In some embodiments, a method of providing adsorptive power to the plurality of second vacuum grooves 230 by the external force generator 300 of the second bonding chuck 200 may be identical to a method of providing adsorptive power to the plurality of first vacuum grooves 130 by the external force generator 400 of the first bonding chuck 100.

The first transformation plate 120 may be mounted onto the first base 110 in a manner allowing a distance to the first base 110 to vary. For example, an outer circumference of the first transformation plate 120 may be fixed to the first base 110, and an inner portion of the fixed outer circumference of the first transformation plate 120 may be transformed into a convex shape by external force.

The first transformation plate 120 may be transformed while supporting the first substrate S1, and accordingly, the first substrate S1 may be transformed forcibly. In this regard, a curvature of the forcibly transformed first substrate S1 may be adjusted by a curvature of the first transformation plate 120.

In some embodiments, the first transformation plate 120 may include a metal, ceramics, rubber, or a combination thereof. For example, the first transformation plate 120 may include aluminum or silicon carbide (SiC).

Figure 6:
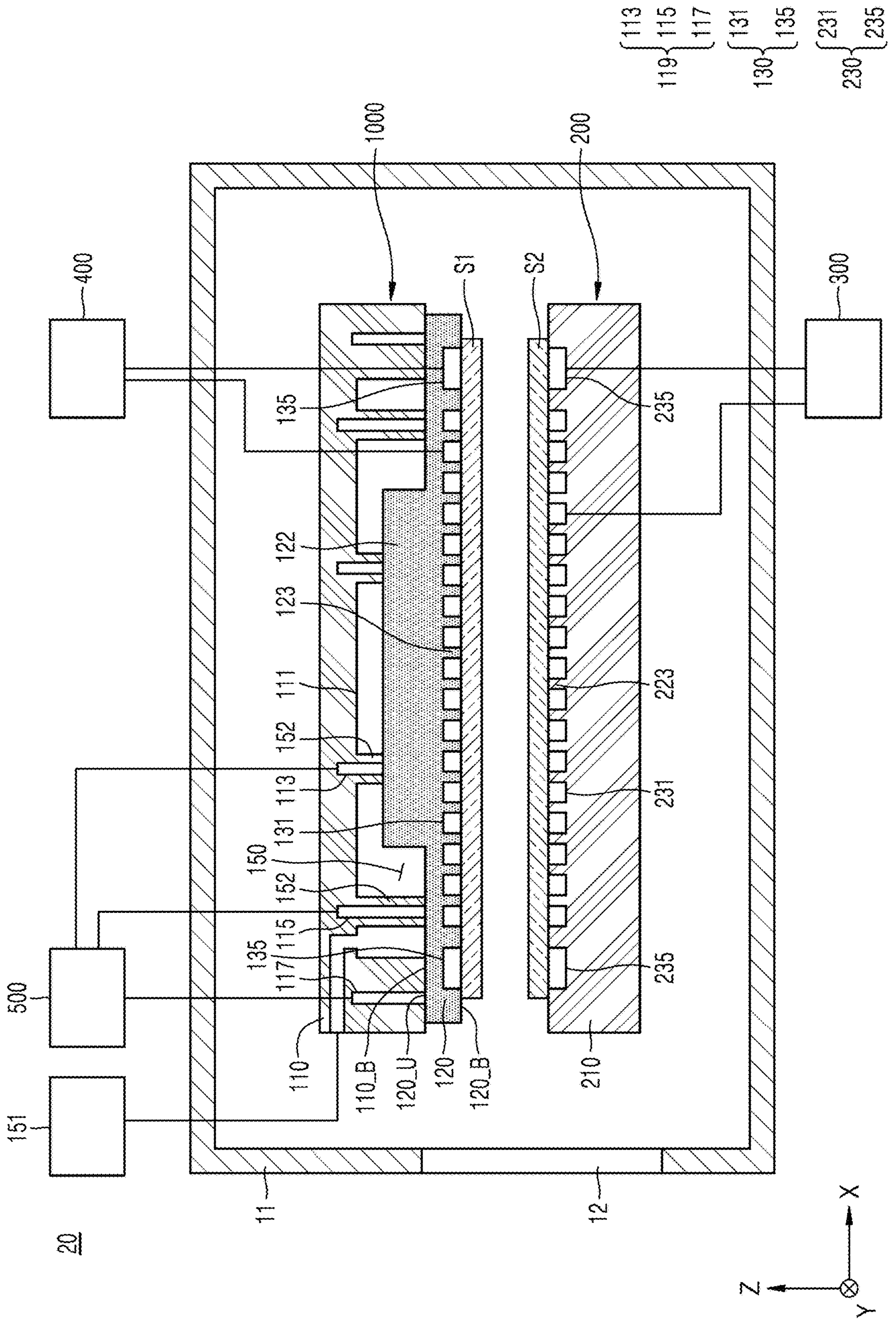
FIG. 6 is a schematic cross-sectional diagram of a substrate bonding apparatus according to some embodiments.
Figure 7:
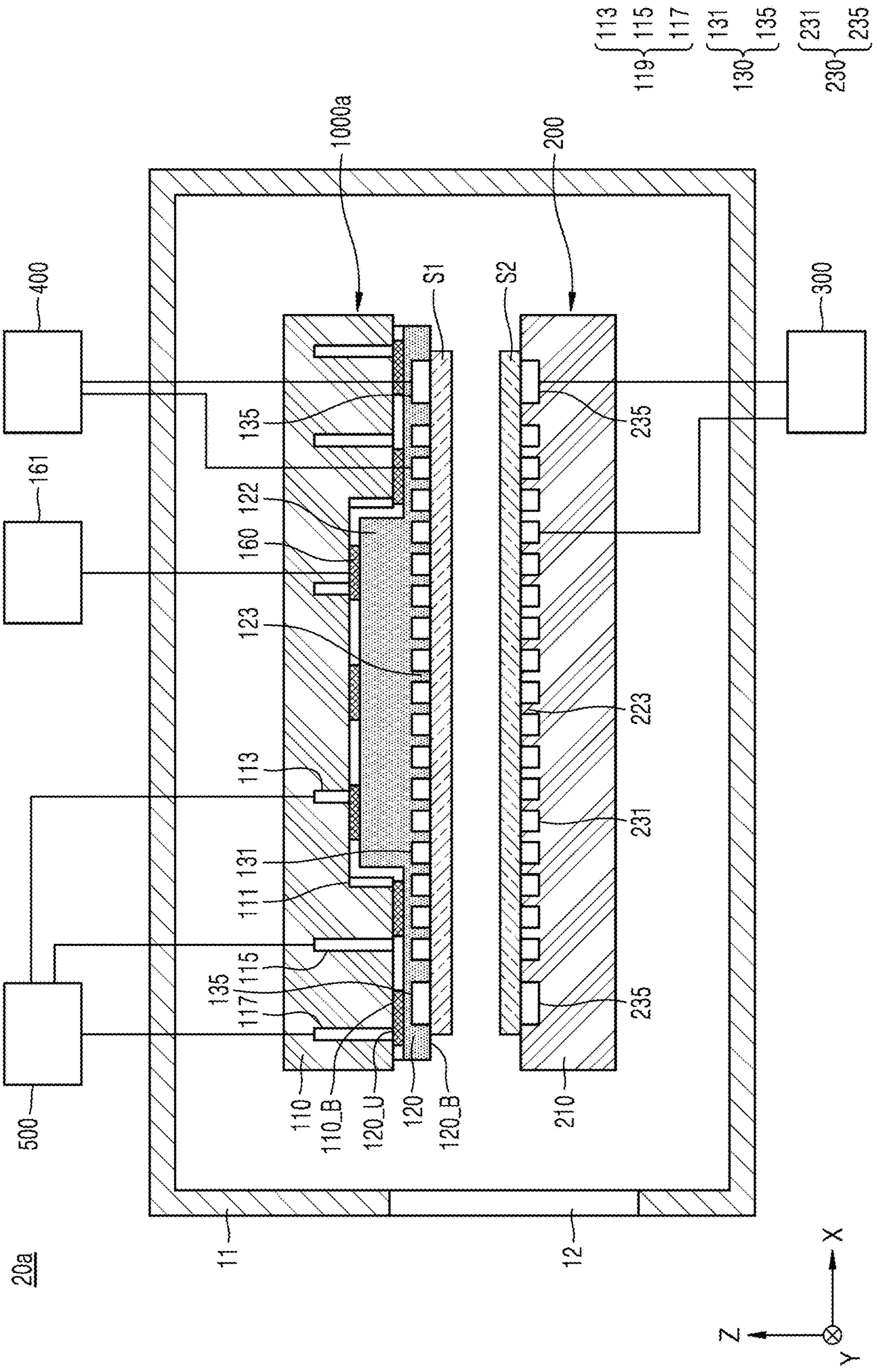
FIG. 7 is a schematic cross-sectional diagram of a substrate bonding apparatus according to some embodiments.

In some embodiments, the distance between the first transformation plate 120 and the first base 110 may be changed by the push rod 140, an air pressure regulator 151 of FIG. 6, or a piezoelectric sheet 160 of FIG. 7. That is, by the push rod 140, the air pressure regulator 151 of FIG. 6 or the piezoelectric sheet 160 of FIG. 7, the inner portion of the fixed outer circumference of the first transformation plate 120 may be transformed into a convex shape.

An embodiment of transformation of the first transformation plate 120 through the air pressure regulator 151 of FIG. 6 or the piezoelectric sheet 160 of FIG. 7 is described below with reference to FIGS. 6 and 7. Hereinafter, an embodiment of transformation of the first transformation plate 120 through the push rod 140 is described.

In some embodiments, the first bonding chuck 100 may further include the push rod 140. The push rod 140 may be mounted onto the central portion of the first base 110 movably in the vertical direction. The push rod 140 may reciprocate in a direction substantially perpendicular to the first substrate S1 (e.g., Z direction).

The push rod 140 may include an actuator to implement the reciprocating motion. For example, the actuator of the push rod 140 may include a multilayer piezoelectric actuator, a voice coil motor, a lag and pinion combined with a motor, etc.

The push rod 140 may physically press and transform the first transformation plate 120. The push rod 140 may physically press and transform the first protrusion 122 of the first transformation plate 120. That is, the push rod 140 may vertically move in a direction from the first base 110 towards the first transformation plate 120 to push and transform the first protrusion 122 of the first transformation plate 120.

When the push rod 140 physically presses the first transformation plate 120, the external force generator 500 may release the adsorptive power of some of the plurality of vacuum lines 119. In some embodiments, when the push rod 140 physically presses the first transformation plate 120, the external force generator 500 may release the adsorptive power of the center vacuum line 113 to transform the central area CA of the first transformation plate 120. Then, when the external force generator 500 releases the adsorptive power to a middle vacuum line 115, by the pressure of the push rod 140, the transformation may expand to the edge area EA of the first transformation plate 120. However, during the transformation of the first transformation plate 120, the adsorptive power to an edge vacuum line 117 may be maintained by the external force generator 500 such that the outer circumference of the first transformation plate 120 is fixed to the first base 110.

Through the first transformation plate 120 including the first protrusion 122, the stress applied to the central area of the first substrate S1 may be reduced. That is, during the process of bonding the substrate through the first protrusion 122, the area pressing the first substrate S1 may widen, and the stress concentrated on the central area of the first substrate S1 may disperse. As the stress concentrated on the central area of the first substrate S1 is reduced, permanent transformation of the first substrate S1 may be suppressed and the reliability of substrate bonding process may be improved. That is, as permanent transformation of the first substrate S1 is limited and/or suppressed, misalignment of the bonding pad of the first substrate S1 with the bonding pad of the second substrate S2 may also be limited and/or suppressed.

With reference to FIGS. 1 and 2A to 2D, a substrate bonding method (S10) according to an embodiment of inventive concepts may include mounting the first substrate S1 and the second substrate S2 onto the first bonding chuck 100 and the second bonding chuck 200, respectively (S110), aligning the first bonding chuck 100 on the second bonding chuck 200 to align the first substrate S1 with the second substrate S2 (S120), transforming the first transformation plate 120 of the first bonding chuck 100 to transform the first substrate S1 into convex shape (S130), initiating bonding of the first substrate S1 and the second substrate S2 by releasing adsorptive power to a central area of the first bonding chuck 100 (S140), spreading a bonding area from a bonding initiation point toward an edge area (S150), and unloading a bonded substrate (S160).

Hereinafter, a substrate bonding method is described with reference to FIGS. 1 and 2A to 2D.

With reference to FIGS. 1 and 2A, the first substrate S1 and the second substrate S2 may be mounted on the first bonding chuck 100 and the second bonding chuck 200, respectively (S110). The first bonding chuck 100 may be an upper bonding chuck and the second bonding chuck 200 may be a lower bonding chuck arranged below the first bonding chuck 100.

The first substrate S1 may be mounted onto the first bonding chuck 100 such that an inactive surface of the first substrate S1 is in contact with the first bonding chuck 100, and the second substrate S2 may be mounted onto the second bonding chuck 200 such that an inactive surface of the second substrate S2 is in contact with the second bonding chuck 200. A second bonding surface of the second substrate S2 mounted onto the second bonding chuck 200 may face a first bonding surface of the first substrate S1 mounted onto the first bonding chuck 100.

In some embodiments, the first bonding chuck 100 may vacuum-adsorb the first substrate S1 such that the first substrate S1 is fixed, and the second bonding chuck 200 may vacuum-adsorb the second substrate S2 such that the second substrate S2 is fixed.

In some embodiments, the first bonding chuck 100 and the second bonding chuck 200 may each support the substrates by a method using Bernoulli's theorem, or may be an electrostatic chuck supporting a substrate by using electrostatic force.

After mounting the first substrate S1 and the second substrate S2 onto the first bonding chuck 100 and the second bonding chuck 200 respectively, the first bonding chuck 100 may be aligned on the second bonding chuck 200 (S120). The first bonding chuck 100 may be aligned on the second bonding chuck 200 such that the bonding surface of the first substrate S1 is aligned with the bonding surface of the second substrate S2. That is, the first bonding chuck 100 or the second bonding chuck 200 may be moved such that a bonding pad of the second substrate S2 is aligned with a bonding pad of the first substrate S1.

Next, with reference to FIGS. 1 and 2B, the first transformation plate 120 of the first bonding chuck 100 may be transformed into a convex shape to transform the first substrate S1 into a convex shape (S130).

The first bonding chuck 100 may include the first base 110 and the first transformation plate 120 mounted onto the first base 110. The first transformation plate 120 may include the first protrusion 122 on a first surface 120_U. The outer circumference of the first transformation plate 120 may be fixed to the first base 110, and the inner portion of the fixed outer circumference of the first transformation plate 120 may be transformed into a convex shape by external force.

When the first substrate S1 is adsorbed onto the first transformation plate 120, the first transformation plate 120 may be transformed to be convex downward and may forcibly transform the first substrate S1 to be convex downward. In this regard, the curvature of the forcibly transformed first substrate S1 may be adjusted by the curvature of the first transformation plate 120.

In some embodiments, the first transformation plate 120 may be physically pressed and transformed. For example, the transformation of the first transformation plate 120 may be performed by the push rod 140 pressing the first transformation plate 120 downward. The push rod 140 may physically press and transform the first protrusion 122 of the first transformation plate 120. That is, the push rod 140 may vertically move in a direction from the first base 110 towards the first transformation plate 120 to push and transform the first protrusion 122 of the first transformation plate 120.

When the push rod 140 presses the first transformation plate 120, the external force generator 500 may adjust the adsorptive power of the plurality of vacuum lines 119 individually. Accordingly, the outer circumference portion of the first transformation plate 120 may be fixed to the first base 110, and the inner portion of the outer circumference of the first transformation plate 120 may be transformed into a convex shape.

After the first substrate S1 is transformed, the adsorptive power for the central area of the first transformation plate 120 may be released to initiate bonding between the first substrate S1 and the second substrate S2 (S140). The external force generator 400 may release the adsorptive power to the inner vacuum groove 131 while maintaining the adsorptive power to the edge vacuum groove 135.

When the adsorption for the central area of the first substrate S1 is released, the central area of the first substrate S1 may be transformed into a convex shape, and the first substrate S1 and the second substrate S2 may be in contact with each other at one contact point.

The contact point may be defined as a bonding initiation point at which the bonding between the first substrate S1 and the second substrate S2 initiates. For example, the bonding initiation point may be a point at which the center of the first bonding surface of the first substrate S1 meets the center of the second bonding surface of the second substrate S2.

With reference to FIGS. 1 and 2C, after the first substrate S1 and the second substrate S2 are bonded at the bonding initiation point, the bonding area between the first substrate S1 and the second substrate S2 may spread from the bonding initiation point towards the edge area (S150).

To spread the bonding area, the adsorption of the first substrate S1 may be gradually released in a direction from the center of the first substrate S1 towards the edge area of the first substrate S1, allowing the spread of the bonding area between the first substrate S1 and the second substrate S2.

In some embodiments, when the external force generator 300 releases the adsorptive power to the inner vacuum groove 131, the first substrate S1 and the second substrate S2 may be voluntarily bonded to each other without other external force applied thereto. By the voluntary bonding between the first substrate S1 and the second substrate S2, the central area and the middle area of the first substrate S1 may be respectively bonded to the central area and the middle area of the second substrate S2.

In some embodiments, when the bonding between the first substrate S1 and the second substrate S2 spreads, the distance between the first bonding chuck 100 and the second bonding chuck 200 may decrease, and the central area CA of the second surface 120_B of the first transformation plate 120 may be flattened.

Next, when the first bonding chuck 100 releases the adsorptive power to the edge vacuum groove 135, the edge area of the first substrate S1 and the edge area of the second substrate S2 may be voluntarily bonded to each other without out external force applied thereto. When the bonding between the edge area of the first substrate S1 and the edge area of the second substrate S2 is completed, the first bonding surface of the first substrate S1 and the second bonding surface of the second substrate S2 may be bonded together to form a bonded substrate BS.

With reference to FIGS. 1 and 2D, when the bonding between the first substrate S1 and the second substrate S2 is completed, the bonded substrate BS may be unloaded from the second bonding chuck 200 (S160). To unload the bonded substrate BS, the first bonding chuck 100 may be moved in a direction away from the second bonding chuck 200, and the plurality of vacuum lines 119 may fix the first transformation plate 120 to the first base 110. The second bonding chuck 200 may release overall adsorption of the bonded substrate BS.

Figure 3:
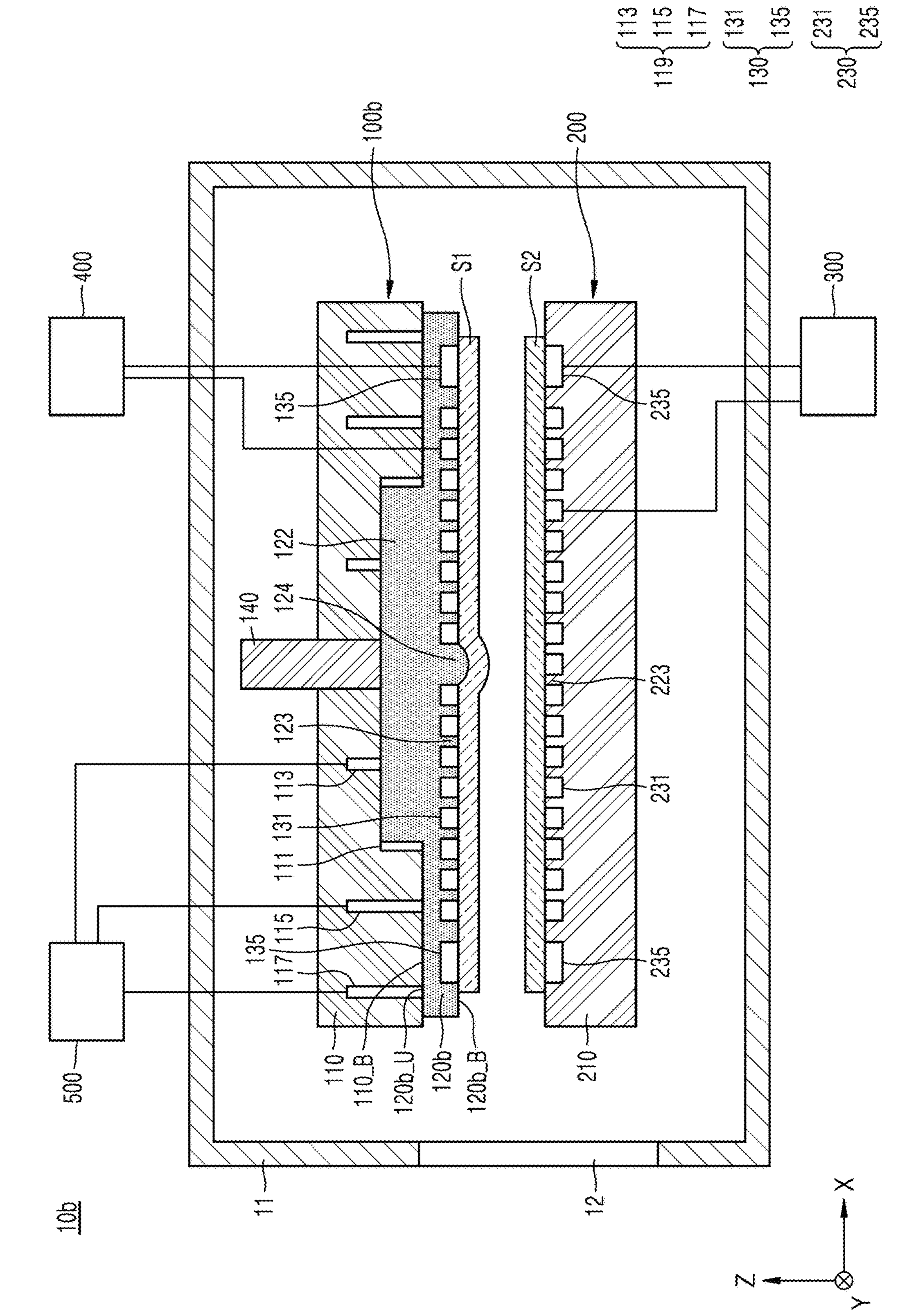
FIG. 3 is a schematic cross-sectional diagram of a substrate bonding apparatus according to some embodiments.

FIG. 3 is a schematic cross-sectional diagram of a substrate bonding apparatus according to some embodiments.

With reference to FIG. 3, a substrate bonding apparatus **10*b* may include a chamber 11, a first bonding chuck 100*b*, and a second bonding chuck 200**.

Hereinafter, differences between the substrate bonding apparatus **10*b* of FIG. 3 and the substrate bonding apparatus 10 of FIG. 2**A are described, and any redundant description thereon will be omitted.

The first bonding chuck **100*b* of the substrate bonding apparatus 10*b* may include a first base 110 and a first transformation plate 120*b***.

The first transformation plate **120*b* may include a second protrusion 124. The second protrusion 124 may be located at the center of a second surface 120*b*_B of the first transformation plate 120*b*. In other words, the first transformation plate 120*b* may include the second protrusion 124 at a portion in contact with the center of the first substrate S1. For example, the second protrusion 124 may be located at the center of the inner vacuum grooves 131 of the first transformation plate 120**.

A thickness of the first transformation plate **120*b* at the portion where the second protrusion 124 is formed may be greater than a thickness of other portions of the first transformation plate 120*b* minus the second protrusion 124. That is, the portion including the second protrusion 124 may be the thickest portion of the first transformation plate 120. In some embodiments, the second protrusion 124** may have a convex shape.

In some embodiments, the height of the second protrusion 124 may be greater than the height of the plurality of dimples 123. That is, when the first substrate S1 is mounted onto the first bonding chuck 100, the first substrate S1 may be in contact with the second protrusion 124 before the first substrate S1 is in contact with the plurality of dimples 123. For example, the height of the second protrusion 124 may be greater than the height of the plurality of dimples 123 by about 5 μm to about 15 μm.

The shape of the area of the first substrate S1 in contact with the second protrusion 124 may be changed by the second protrusion 124. As the first substrate S1 transformed by the second protrusion 124 may be in contact with the second substrate S2 even when the first transformation plate 120 is slightly transformed, the reliability of the substrate bonding process may be improved.

Figure 4:
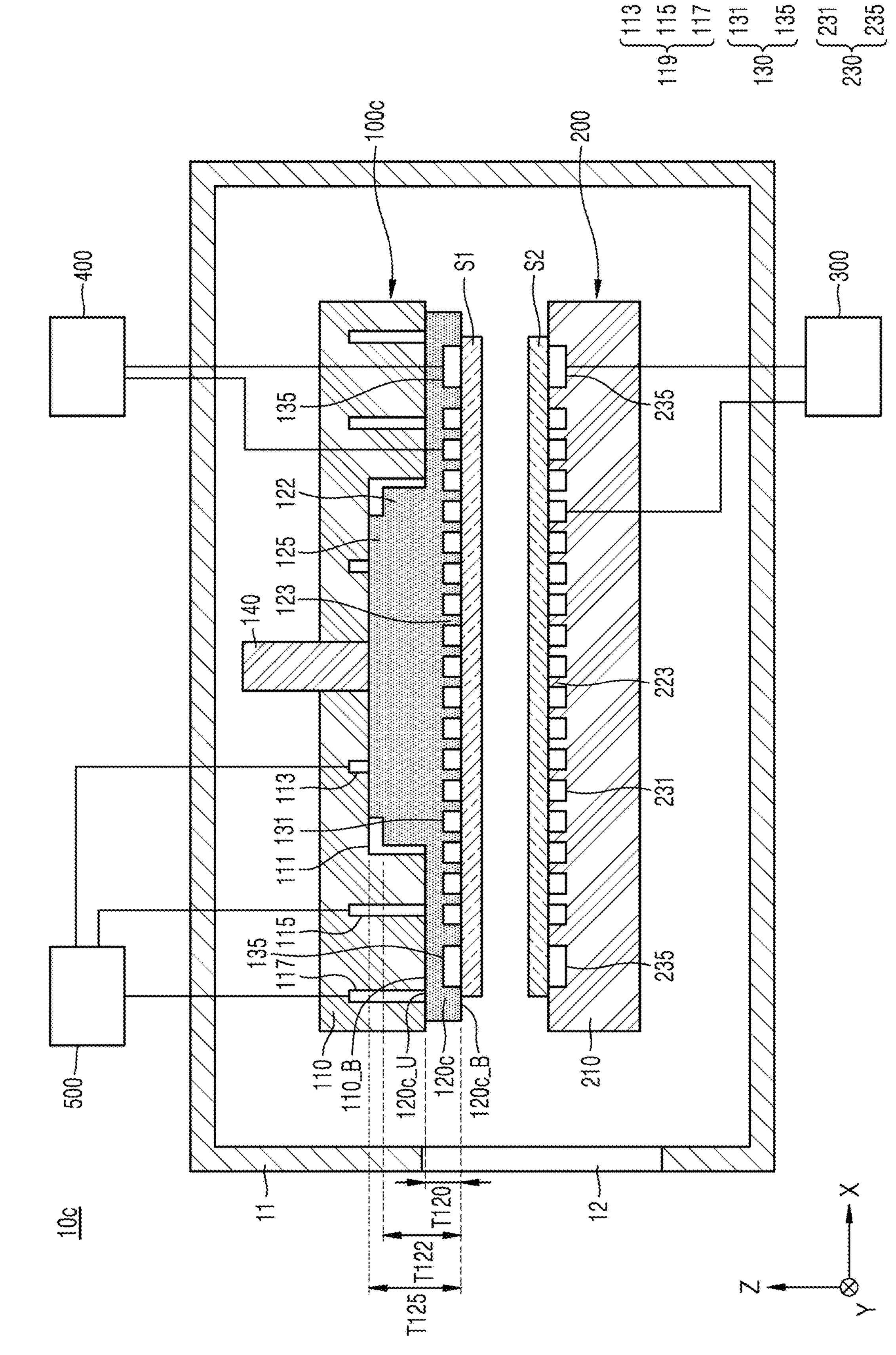
FIG. 4 is a schematic cross-sectional diagram of a substrate bonding apparatus according to some embodiments.

FIG. 4 is a schematic cross-sectional diagram of a substrate bonding apparatus according to some embodiments.

With reference to FIG. 4, a substrate bonding apparatus **10*c* may include a chamber 11, a first bonding chuck 100*c*, and a second bonding chuck 200**.

Hereinafter, differences between the substrate bonding apparatus **10*c* of FIG. 4 and the substrate bonding apparatus 10 of FIG. 2**A are described, and any redundant description thereon will be omitted.

The first bonding chuck **100*c* of the substrate bonding apparatus 10*c* may include a first base 110 and a first transformation plate 120*c***.

The first transformation plate **120*c* may further include a third protrusion 125. The third protrusion 125 may be arranged on the top surface of the first protrusion 122. That is, the first transformation plate 120*c* may include the third protrusion 125 protruding outward from the top surface of the first protrusion 122. In some embodiment, the push rod 140 may physically press the third protrusion 125**.

The thickness of the first transformation plate **120*c* may be a first thickness T120 in an area not including the first protrusion 122 and the third protrusion 125, may be a second thickness T122 in an area including the first protrusion 122 and not including the third protrusion 125, and may be a third thickness T125 in an area including the first protrusion 122 and the third protrusion 125. The first thickness T120 may be less than the second thickness T122, and the second thickness T122 may be less than the third thickness T125. That is, the first transformation plate 120*c* may increase in thickness towards the center of the first surface 120*c*_U**.

Through the first protrusion 122 and the third protrusion 125, the stress that occurs at the central area of the first substrate S1 may disperse. As the first substrate S1 transformed by the evenly dispersed stress may be less likely to be permanently transformed, the reliability of the substrate bonding process may increase.

Figure 5A:
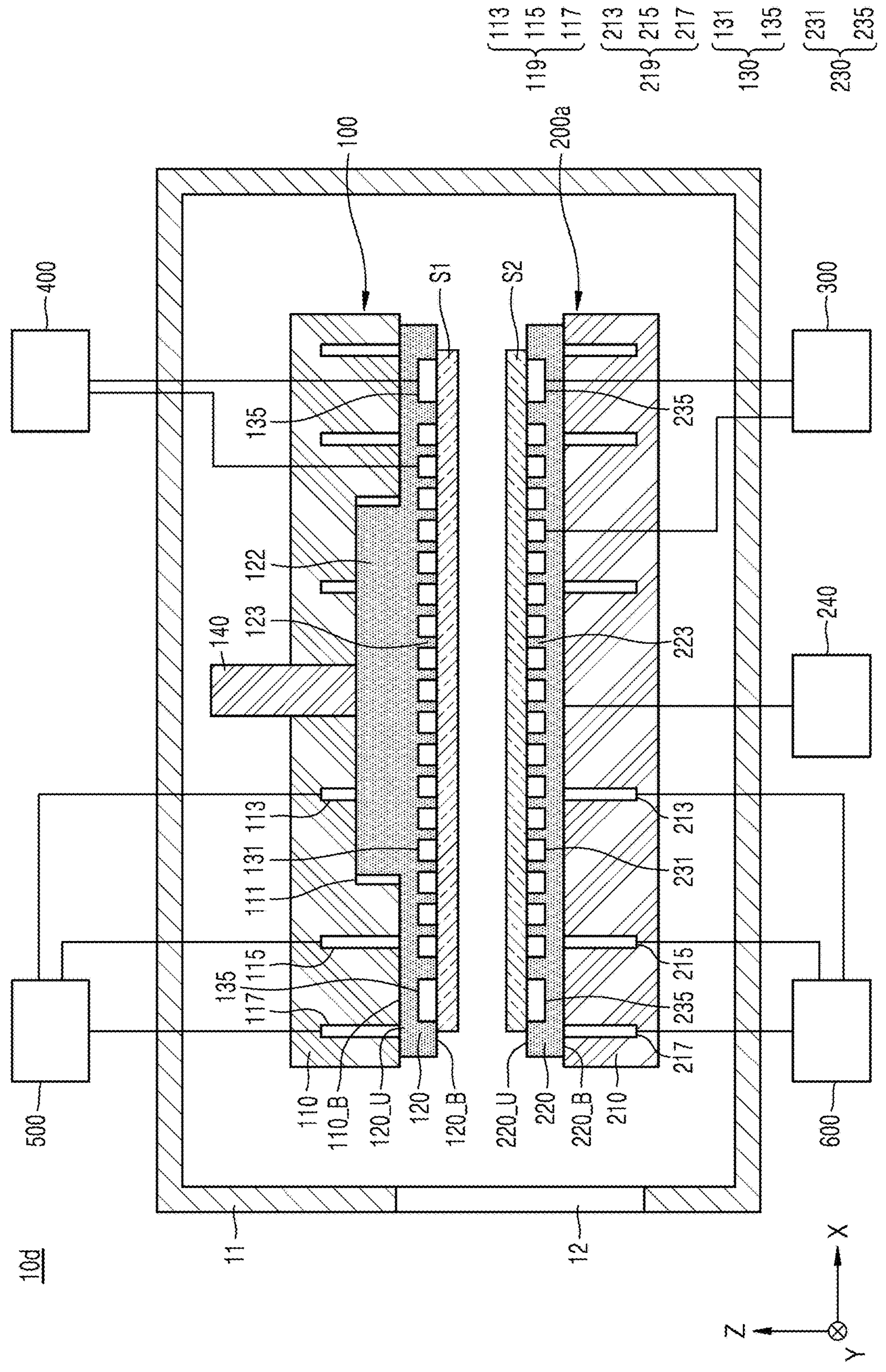
FIGS. 5A and 5B are a schematic cross-sectional diagrams of a substrate bonding apparatus according to some embodiments.
Figure 5B:
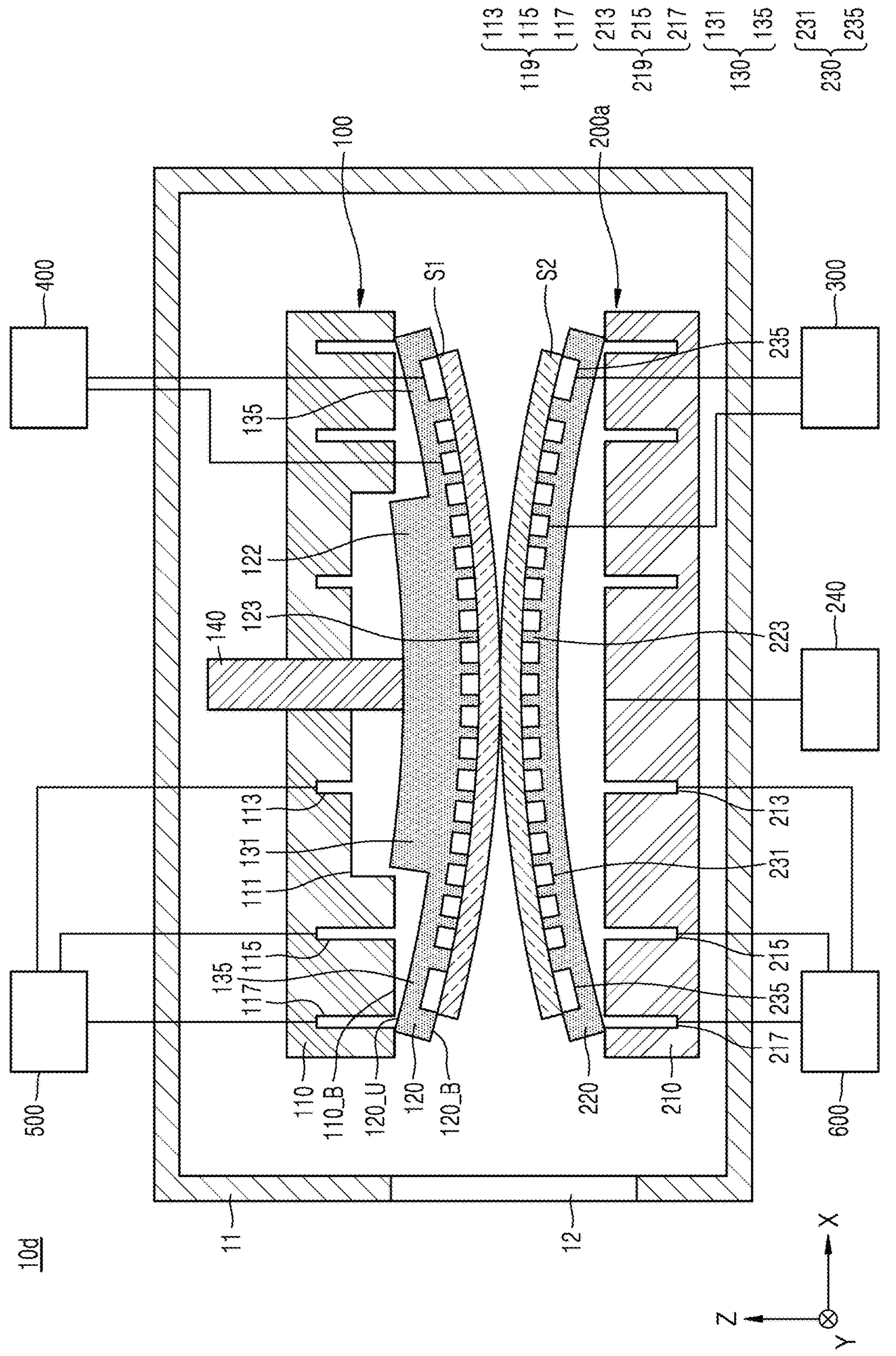

FIGS. 5A and 5B are schematic cross-sectional diagrams of a substrate bonding apparatus according to some embodiments.

With reference to FIGS. 5A and 5B, a substrate bonding apparatus **10*d* may include a chamber 11, a first bonding chuck 100, and a second bonding chuck 200*a***.

Hereinafter, differences between the substrate bonding apparatus **10*d* of FIG. 5A and the substrate bonding apparatus 10 of FIG. 2**A are described, and any redundant description thereon will be omitted.

The second bonding chuck **200*a* of the substrate bonding apparatus 10*d* may include a second base 210 and a second transformation plate 220**.

The second transformation plate 220 may be mounted onto a surface of the second base 210 of the second bonding chuck **200*a*. The second transformation plate 220 may be supported by and mounted onto the second base 210 through a plurality of vacuum lines 219. That is, the plurality of vacuum lines 219 may provide adsorptive power between the second base 210 and the second transformation plate 220. In other words, the plurality of vacuum lines 219 may provide adsorptive power to support the second transformation plate 220 on one surface of the second base 210 which is in contact with the second transformation plate 220**.

In some embodiments, an external force generator 600 forming adsorptive power to the plurality of vacuum lines 219 may be further provided. The external force generator 600 may adjust the adsorptive power of the plurality of vacuum lines 219 separately.

On a first surface 220_U, the second transformation plate 220 of the second bonding chuck **200*a* may support the second substrate S2. The plurality of second vacuum grooves 230 may be located in the first surface 220_U of the second transformation plate 220. The plurality of second vacuum grooves 230 may form adsorptive power between the second substrate S2 and the second transformation plate 220. The second bonding chuck 200*a* may include an external force generator 300 configured to form adsorptive power to the plurality of second vacuum grooves 230**.

In some embodiments, a method of supporting the second substrate S2 by the second transformation plate 220 may be at least one of the methods of supporting the second substrate S2 by the second bonding chuck 200 of FIG. 2A described above.

On a second surface of the second transformation plate 220, the second transformation plate 220 may be mounted onto the second base 210 in a manner allowing a distance to the second base 210 to vary. For example, an outer circumference of the second transformation plate 220 may be fixed to the second base 210, and an inner portion of the fixed outer circumference of the second transformation plate 220 may be transformed into a convex shape by external force.

The second transformation plate 220 may be transformed while supporting the second substrate S2, and accordingly, the second substrate S2 may be transformed forcibly. In this regard, a curvature of the forcibly transformed second substrate S2 may be adjusted by a curvature of the second transformation plate 220.

In some embodiments, the second transformation plate 220 may include a metal, ceramics, rubber, or a combination thereof. For example, the second transformation plate 220 may include aluminum or silicon carbide (SiC).

In some embodiments, the second transformation plate 220 may be mounted onto the second base 210 symmetrically with a shape substantially identical to the first transformation plate (120 of FIG. 2A and 120*b* of FIG. 3).

In some embodiments, the second bonding chuck 200*a* may further include an adjuster 240 configured to transform a shape of the second transformation plate 220.

The adjuster 240 of the second bonding chuck 200*a* may transform the second transformation plate 220 to be convex upward. The adjuster 240 may transform the shape of the second transformation plate 220 by a method using physical pressure, a method using air pressure, or a method using a piezoelectric element.

When the adjuster 240 transforms the second transformation plate 220, the external force generator 600 may release the adsorptive power to some of the plurality of vacuum lines 219. In some embodiments, when the adjuster 240 transforms the second transformation plate 220, the external force generator 600 may release the adsorptive power to a center vacuum line 213 to transform the central area of the second transformation plate 220. Then, when the external force generator 600 releases the adsorptive power to a middle vacuum line 215, by the external pressure of the adjuster 240, the transformation may expand to the edge area of the second transformation plate 220. However, during the transformation of the second transformation plate 220, the adsorptive power to an edge vacuum line 217 may be maintained by the external force generator 600 such that the outer circumference of the second transformation plate 220 is fixed to the second base 210.

In some embodiments, when the adjuster 240 transforms the second transformation plate 220 by a method using physical pressure, the adjuster 240 may include a push rod. The adjuster 240 may physically press the bottom surface of the second transformation plate 220 through the push rod.

In some embodiments, when the adjuster 240 transforms the second transformation plate 220 by a method using air pressure, the adjuster 240 may include an air pressure regulator. The adjuster 240 may regulate pressure of a cavity between the second transformation plate 220 and the second base 210 through the air pressure regulator to transform the shape of the second transformation plate 220.

In some embodiments, when the adjuster 240 transforms the second transformation plate 220 by using a piezoelectric element, the adjuster 240 may include a piezoelectric element and a power supply configured to supply power to the piezoelectric element. The adjuster 240 may apply power to the piezoelectric element arranged under the second transformation plate 220 to transform the shape of the second transformation plate 220.

In the substrate bonding process, through the second bonding chuck 200*a* including the second transformation plate 220, the second substrate S2 may be transformed. After the second substrate S2 is transformed to be convex upward, and the first substrate S1 is transformed to be convex downward, the bonding may be initiated. In the substrate bonding process, each of the first substrate S1 and the second substrate S2 may be transformed, and the stress applied to each substrate may decrease. Accordingly, permanent transformation of each substrate may be limited and/or suppressed, which leads to improved reliability of the substrate bonding process.

FIG. 6 is a schematic cross-sectional diagram of a substrate bonding apparatus according to some embodiments.

With reference to FIG. 6, a substrate bonding apparatus 20 may include a chamber 11, a first bonding chuck 1000, and a second bonding chuck 200.

The substrate bonding apparatus 20 of FIG. 6 is different from the substrate bonding apparatus 10 of FIG. 2A in the method of transforming the first transformation plate 120 but other aspects may be substantially the same.

Hereinafter, differences between the substrate bonding apparatus 20 of FIG. 6 and the substrate bonding apparatus 10 of FIG. 2A are described, and any redundant description thereon will be omitted.

The first bonding chuck 1000 of the substrate bonding apparatus 20 may include a first base 110, a first transformation plate 120, and an air pressure regulator 151.

In some embodiments, the first transformation plate 120 may be the first transformation plate (120 of FIG. 2A, 120*b* of FIG. 3, and 120*c* of FIG. 4) described above.

In some embodiments, the second bonding chuck 200 may be the second bonding chuck (200 of FIG. 2A and 200*a* of FIG. 5A) described above.

The air pressure regulator 151 may regulate the air pressure of a cavity 150 formed between the first base 110 and the first transformation plate 120 to transform the first transformation plate 120. For example, an air flow hole connected to the air pressure regulator 151 and communicating with the cavity 150 may be formed on the first base 110, and the air pressure regulator 151 may inject or discharge air into or from the cavity 150 through the air flow hole formed in the first base 110.

For example, the air pressure regulator 151 may inject air into the cavity 150 to increase pressure of the cavity 150 or discharge air from the cavity 150 to decrease the pressure of the cavity 150. The air pressure regulator 151 may to include a pump for injecting air and/or discharging air from the cavity 150 and the pump may be connected to a valve (not shown) for controlling the increase or decrease of pressure of the cavity 150.

The air pressure regulator 151 may inject air into the cavity 150 to increase pressure of the cavity 150. When the pressure of the cavity 150 increases, the first transformation plate 120 may be transformed into a convex shape, and in correspondence with the transformation of the first transformation plate 120, the first substrate S1 supported by the first transformation plate 120 may also be transformed.

By adjusting the pressure of the cavity 150, the air pressure regulator 151 may adjust the distance between the first transformation plate 120 and the first base 110 and adjust the curvature of the first substrate S1.

FIG. 7 is a schematic cross-sectional diagram of a substrate bonding apparatus according to some embodiments.

With reference to FIG. 7, a substrate bonding apparatus 20*a* may include a chamber 11, a first bonding chuck 1000*a*, and a second bonding chuck 200.

The substrate bonding apparatus 20*a* of FIG. 7 is different from the substrate bonding apparatus 10 of FIG. 2A in the method of transforming the first transformation plate 120 but other aspects may be substantially the same.

Hereinafter, differences between the substrate bonding apparatus 20*a* of FIG. 7 and the substrate bonding apparatus 10 of FIG. 2A are described, and any redundant description thereon will be omitted.

The first bonding chuck 1000*a* of the substrate bonding apparatus 20*a* may include a first base 110, a first transformation plate 120, and a piezoelectric sheet 160. In some embodiments, the substrate bonding apparatus 20*a* may further include a power supply 161 supplying power to the piezoelectric sheet 160.

The piezoelectric sheet 160 of the first bonding chuck 1000*a* may be located on the first surface 120_U of the first transformation plate 120.

When power is applied to the piezoelectric sheet 160, by the piezoelectric effect, a part of the piezoelectric sheet 160 to which power is applied may be transformed locally. For example, by the power applied from the outside, the piezoelectric sheet 160 may locally contract or expand. Such local transformation of the piezoelectric sheet 160 may cause local transformation of the first transformation plate 120.

For example, the piezoelectric sheet 160 may include a plurality of piezoelectric elements. When power is applied to some of the piezoelectric elements, the first transformation plate 120 may be locally transformed near the piezoelectric elements to which power is applied. For example, when first power (e.g., + voltage) is applied to some of the plurality of piezoelectric elements, and a first region of the piezoelectric sheet 160 locally expands, a part of the first transformation plate 120 near the first region of the piezoelectric sheet 160 may be transformed to have more curvature, and accordingly, a distance between the part of the first transformation plate 120 and the first base 110 may increase.

In addition, when second power opposite to the first power (e.g., – voltage) is applied to some of the plurality of piezoelectric elements, and a first region of the piezoelectric sheet 160 locally contracts, a part of the first transformation plate 120 near the first region of the piezoelectric sheet 160 may be transformed to have less curvature, and accordingly, a distance between the part of the first transformation plate 120 and the first base 110 may decrease.

Figure 8:
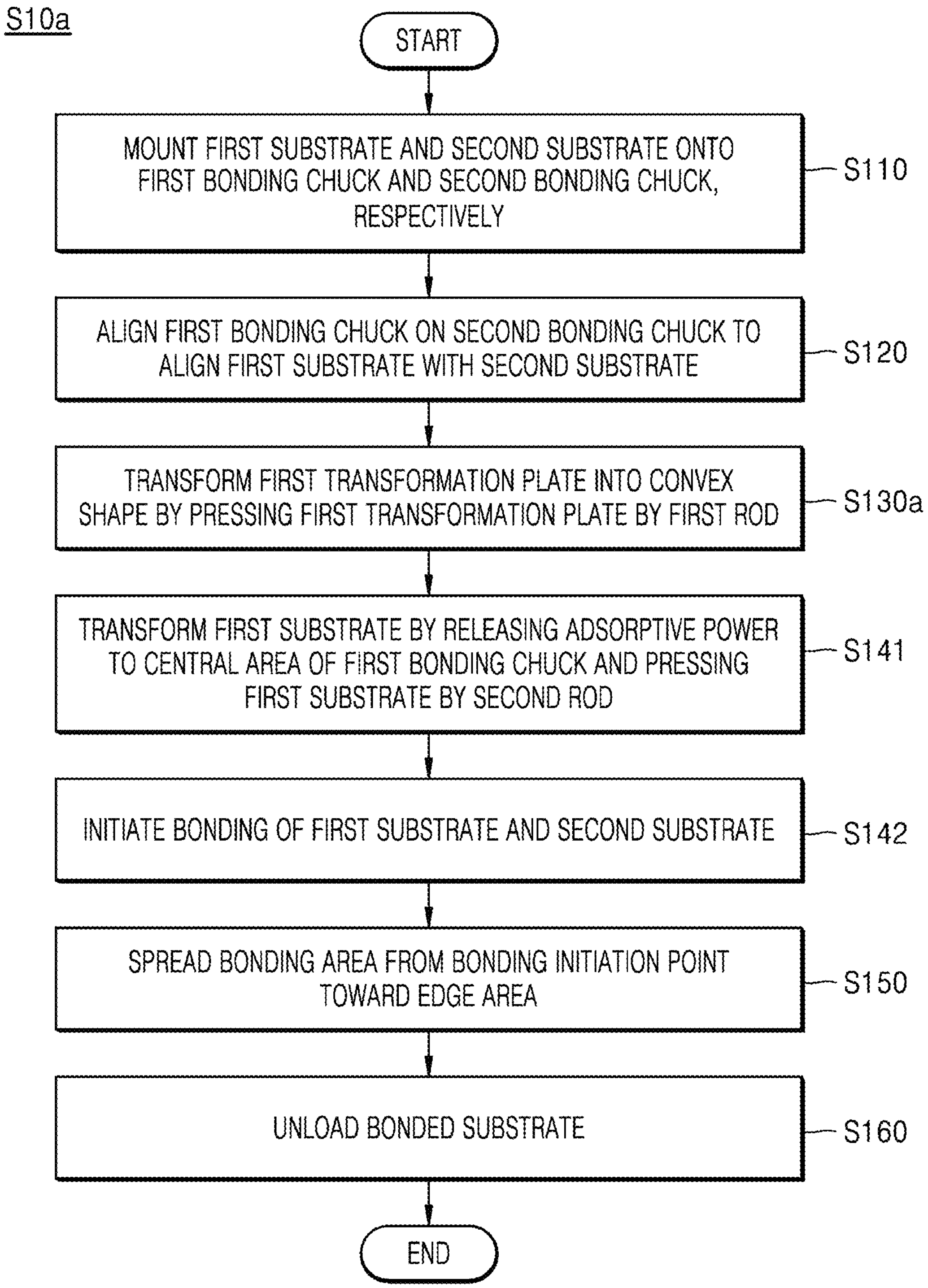
FIG. 8 is a flowchart illustrating a substrate bonding method according to some embodiments.

FIG. 8 is a flowchart illustrating a substrate bonding method according to some embodiments. FIGS. 9A to 9D are cross-sectional diagrams illustrating in order a substrate bonding method using a substrate bonding apparatus according to some embodiments.

A substrate bonding apparatus 30 is first described with reference to FIG. 9A, and then a substrate bonding method S10*a* is described with reference to FIGS. 9A to 9D.

Figure 9A:
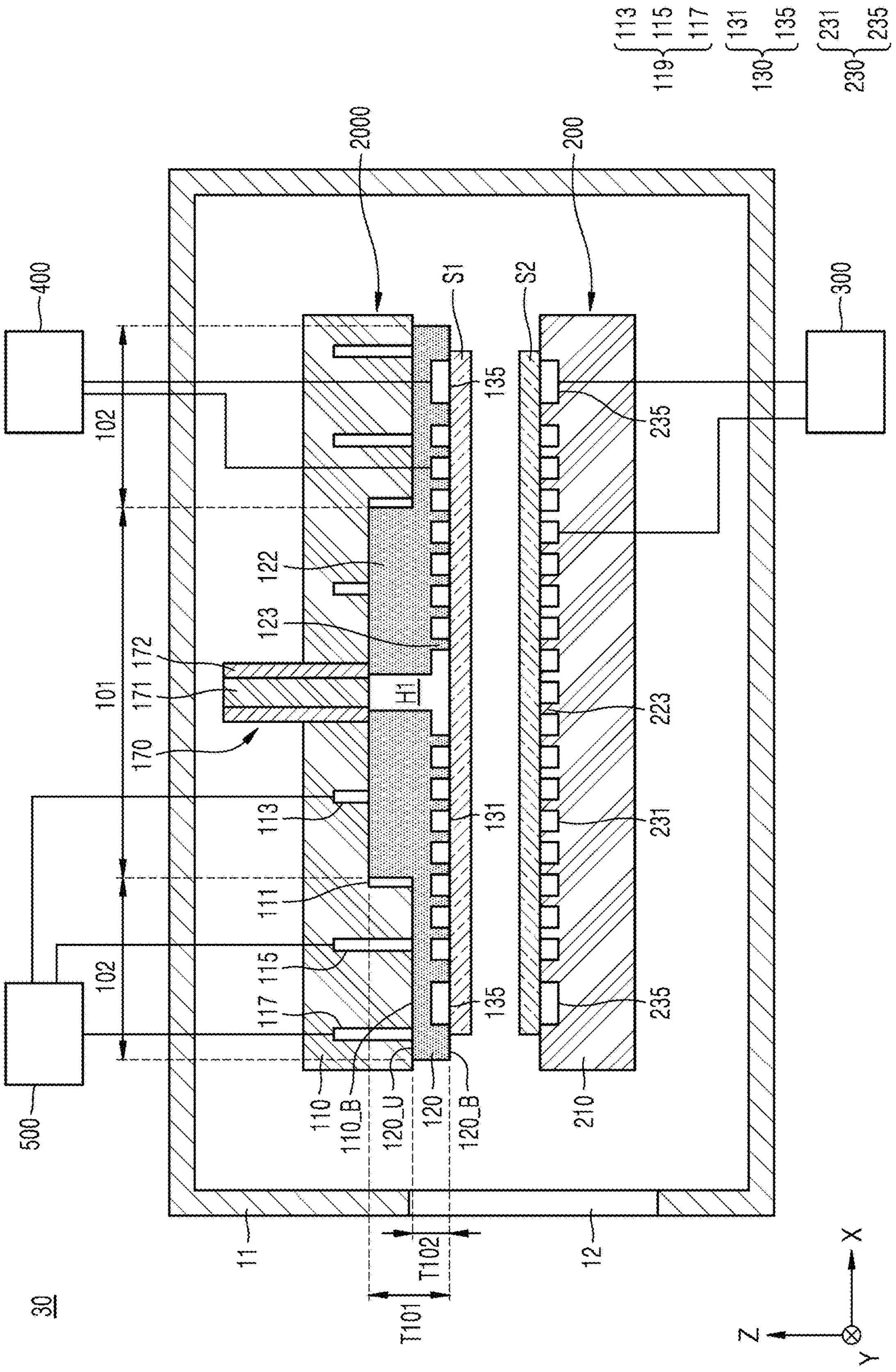
FIGS. 9A to 9D are cross-sectional diagrams illustrating in order a substrate bonding method using a substrate bonding apparatus according to some embodiments.

With reference to FIG. 9A, the substrate bonding apparatus 30 may include a chamber 11, a first bonding chuck 2000, and a second bonding chuck 200.

The substrate bonding apparatus 30 of FIG. 9A is different from the substrate bonding apparatus 10 of FIG. 2A in the structure of the first bonding chuck 2000 but other aspects may be substantially the same.

Hereinafter, differences between the substrate bonding apparatus 30 of FIG. 9A and the substrate bonding apparatus 10 of FIG. 2A are described, and any redundant description thereon will be omitted.

The first bonding chuck 2000 of the substrate bonding apparatus 30 may include a first base 110, a first transformation plate 120, and a pressure rod 170.

On the second surface 120_B, the first transformation plate 120 of the first bonding chuck 2000 may support the first substrate S1, and on the first surface 120_U opposite the second surface 120_B, the first transformation plate 120 may be in contact with the first base 110. The first transformation plate 120 may be mounted onto the first base 110 in a manner allowing a distance to the first base 110 to vary.

The first transformation plate 120 may include a through hole H1. The through hole H1 may be located at the center of the first surface 120_U of the first transformation plate 120. The through hole H1 on the first surface 120_U of the first transformation plate 120 may penetrate the second surface 120_B. That is, the through hole H1 may extend from the first surface 120_U to the second surface 120_B. In some embodiments, one surface of the second substrate S2 may be exposed to the outside through the through hole H1. In some embodiments, the upper portion of the through hole H1 may have a circular or tetragonal shape.

The first transformation plate 120 may include a plurality of areas (e.g., 101 and 102) having different thicknesses from each other. The first transformation plate 120 may include a first area 101 and a second area 102. The first area 101 may be surrounded by the second area 102. The through hole H1 may be located in the first area 101. That is, the first area 101 may include the center of the first surface 120_U of the first transformation plate 120.

The thickness of the first transformation plate 120 may be greater in the first area 101 than in the second area 102. That is, the center of the first transformation plate 120 may be thicker than the edge of the first transformation plate 120.

In some embodiments, the first area 101 may be a circular area having a radius of about 80 mm to about 120 mm from a central point of the first surface 120_U of the first transformation plate 120. The second area 102 may be an area of the first surface 120_U of the first transformation plate 120, excluding the first area 101.

In the first area 101, the length from the first surface 120_U of the first transformation plate 120 to the second surface 120_B of the first transformation plate 120 may be a first length T101, and in the second area 102, the length from the first surface 120_U of the first transformation plate 120 to the second surface 120_B may be a second length T102. The first length T101 may be greater than the second length T102. For example, the first length T101 may be greater than the second length T102 by about 1 mm to about 2 mm. The first length T101 may be about 2 mm to about 5 mm.

The pressure rod 170 of the first bonding chuck 2000 may be mounted onto the first base 110 movably in the vertical direction in the first base 110. That is, the pressure rod 170 may move vertically from the first base 110 towards the first substrate S1.

The pressure rod 170 may vertically move from the first base 110 towards the first substrate S1 and physically press the first substrate S1. The pressure rod 170 may be located at the upper portion or the lower portion of the through hole H1. The pressure rod 170 may move in the vertical direction and pass through the through hole H1. In some embodiments, the pressure rod 170 which has passed through the through hole H1 may physically press the top surface of the first substrate S1.

The pressure rod 170 may press and physically transform one surface of the first substrate S1. In some embodiments, the pressure rod 170 may transform the first substrate S1 to reduce the distance to the second substrate S2. When the bonding between the first substrate S1 and the second substrate S2 is initiated, the pressure rod 170 may press the center of the first substrate S1.

In some embodiments, the first transformation plate 120 may be transformed by a method using physical pressure, a method using air pressure, or a method using a piezoelectric element. The method using air pressure and the method using a piezoelectric element are described later with reference to FIGS. 11 and 12.

With reference to FIG. 9A, the first transformation plate 120 may be transformed by physical pressure. The pressure rod 170 may include a first rod 172 and a second rod 171. The first rod 172 may press the first surface 120_U of the first transformation plate 120, and the second rod 171 may physically press the first substrate S1. The first rod 172 may not pass through the through hole H1 and physically press a sidewall constituting the through hole H1, and the second rod 171 may pass through the through hole H1 and physically press the first substrate S1.

The second rod 171 may be mounted onto the first rod 172 movably in the vertical direction in the first rod 172. That is, the second rod 171 may move in the vertical direction from the inside of the first rod 172 to the outside. In some embodiments, the second rod 171 may protrude from the bottom surface of the first rod 172 and move in the vertical direction.

For example, the pressure rod 170 may be a rod doubly protruding with respect to the first base 110. In other words, the first rod 172 onto which the second rod 171 is mounted may move in the vertical direction from the inside of the first base 110 to the outside, and after the movement of the first rod 172, the second rod 171 may move in the vertical direction from the inside of the first rod 172 to the outside.

With reference to FIGS. 8 and 9A to 9D, a substrate bonding method (S10*a*) according to an embodiment of inventive concepts may include mounting the first substrate S1 and the second substrate S2 onto the first bonding chuck 2000 and the second bonding chuck 200, respectively (S110), aligning the first bonding chuck 2000 on the second bonding chuck 200 to align the first substrate S1 with the second substrate S2 (S120), transforming the first transformation plate 120 of the first bonding chuck 2000 in to a convex shape by the first rod 172 to transform the first substrate S1 into convex shape (S130*a*), transforming the first substrate S1 into a convex shape by releasing adsorptive power to a central area of the first bonding chuck 2000 and pressing the first substrate S1 by the second rod 171 (S141), initiating bonding of the first substrate S1 and the second substrate S2 (S142), spreading a bonding area from a bonding initiation point toward an edge area (S150), and unloading a bonded substrate (S160).

Hereinafter, differences between the substrate bonding method (S10*a*) and the substrate bonding method (S10) of FIG. 1 are described with reference to FIGS. 8 and 9A to 9D, and any redundant description thereon will be omitted.

With reference to FIGS. 8 and 9A, the first substrate S1 and the second substrate S2 may be mounted on the first bonding chuck 2000 and the second bonding chuck 200, respectively (S110).

In some embodiments, the first bonding chuck 2000 may vacuum-adsorb the first substrate S1 such that the first substrate S1 is fixed, and the second bonding chuck 200 may vacuum-adsorb the second substrate S2 such that the second substrate S2 is fixed.

In some embodiments, the first bonding chuck 2000 and the second bonding chuck 200 may each support the substrates by a method using principles of Bernoulli's theorem, or may be an electrostatic chuck supporting a substrate by using electrostatic force.

After mounting the first substrate S1 and the second substrate S2 onto the first bonding chuck 2000 and the second bonding chuck 200 respectively, the first bonding chuck 2000 may be aligned on the second bonding chuck 200 (S120).

Figure 9B:
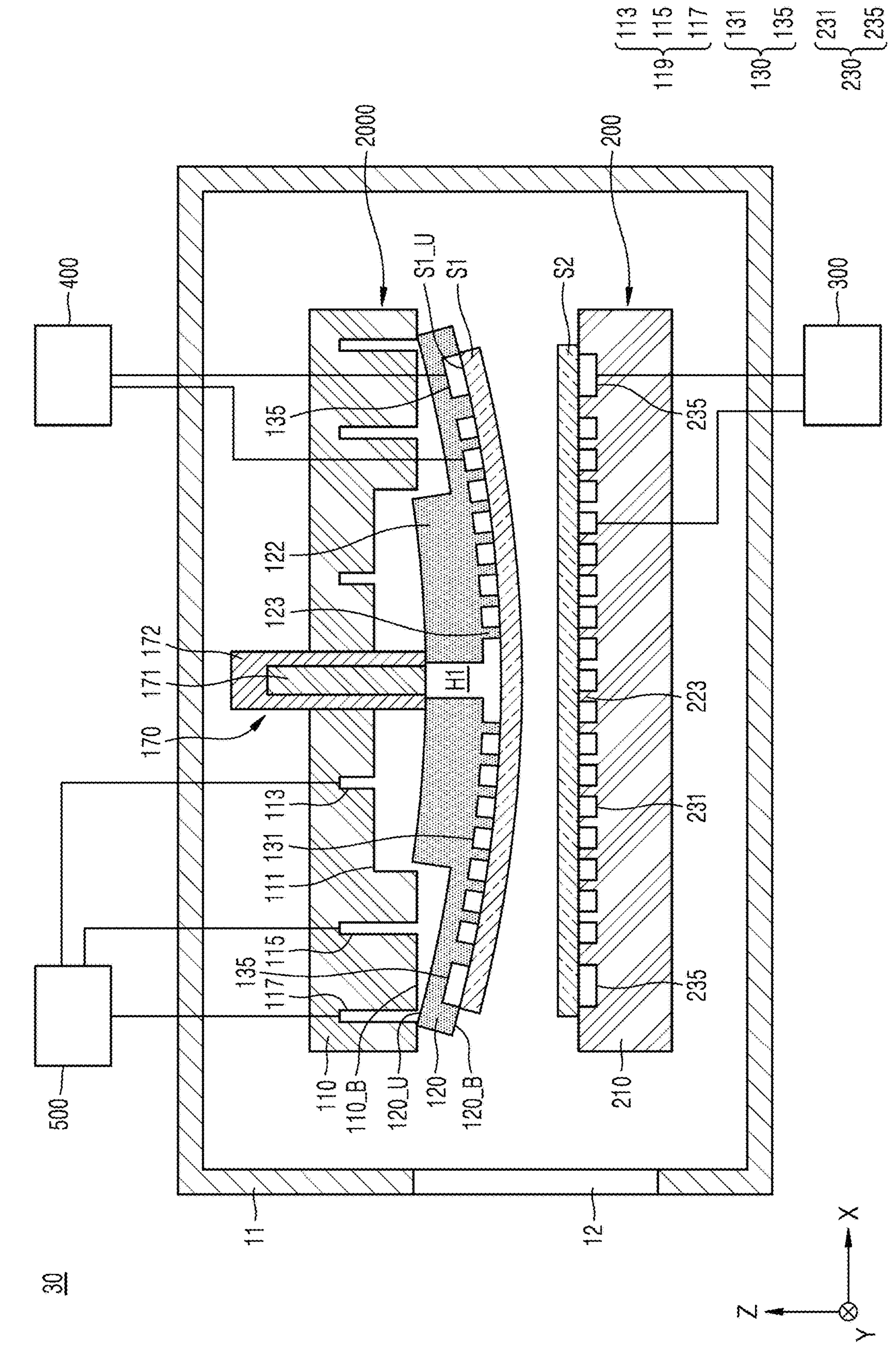

Next, with reference to FIGS. 8 and 9B, the first transformation plate 120 of the first bonding chuck 2000 may be pressed by the first rod 172 and transformed into a convex shape (S130*a*).

The first bonding chuck 2000 may include the first base 110 and the first transformation plate 120 mounted onto the first base 110. The first transformation plate 120 may include the first protrusion 122 on a first surface 120_U. The outer circumference of the first transformation plate 120 may be fixed to the first base 110, and the inner portion of the fixed outer circumference of the first transformation plate 120 may be transformed into a convex shape by external force.

When the first substrate S1 is adsorbed onto the first transformation plate 120, the first transformation plate 120 may be transformed to be convex downward and may forcibly transform the first substrate S1 to be convex downward. In this regard, the curvature of the forcibly transformed first substrate S1 may be adjusted by the curvature of the first transformation plate 120.

During the transformation of the first transformation plate 120, the adsorptive power of the plurality of first vacuum grooves 130 of the first transformation plate 120 may be maintained to fix the first substrate S1 onto the first transformation plate 120. Moreover, during the transformation of the first transformation plate 120, the vacuum of some of the plurality of vacuum lines 119 of the first base 110 may be released. By releasing the adsorptive power of the center vacuum line 113, the inner portion of the outer circumference of the first transformation plate 120 may be transformed, and by maintaining the adsorptive power of the edge vacuum line 117, the outer circumference of the first transformation plate 120 may be fixed to the first base 110.

Although FIG. 9B illustrates the example of physically pressing and transforming the first transformation plate 120 by the first rod 172, the method of transforming the first transformation plate 120 is not limited thereto.

Figure 9C:
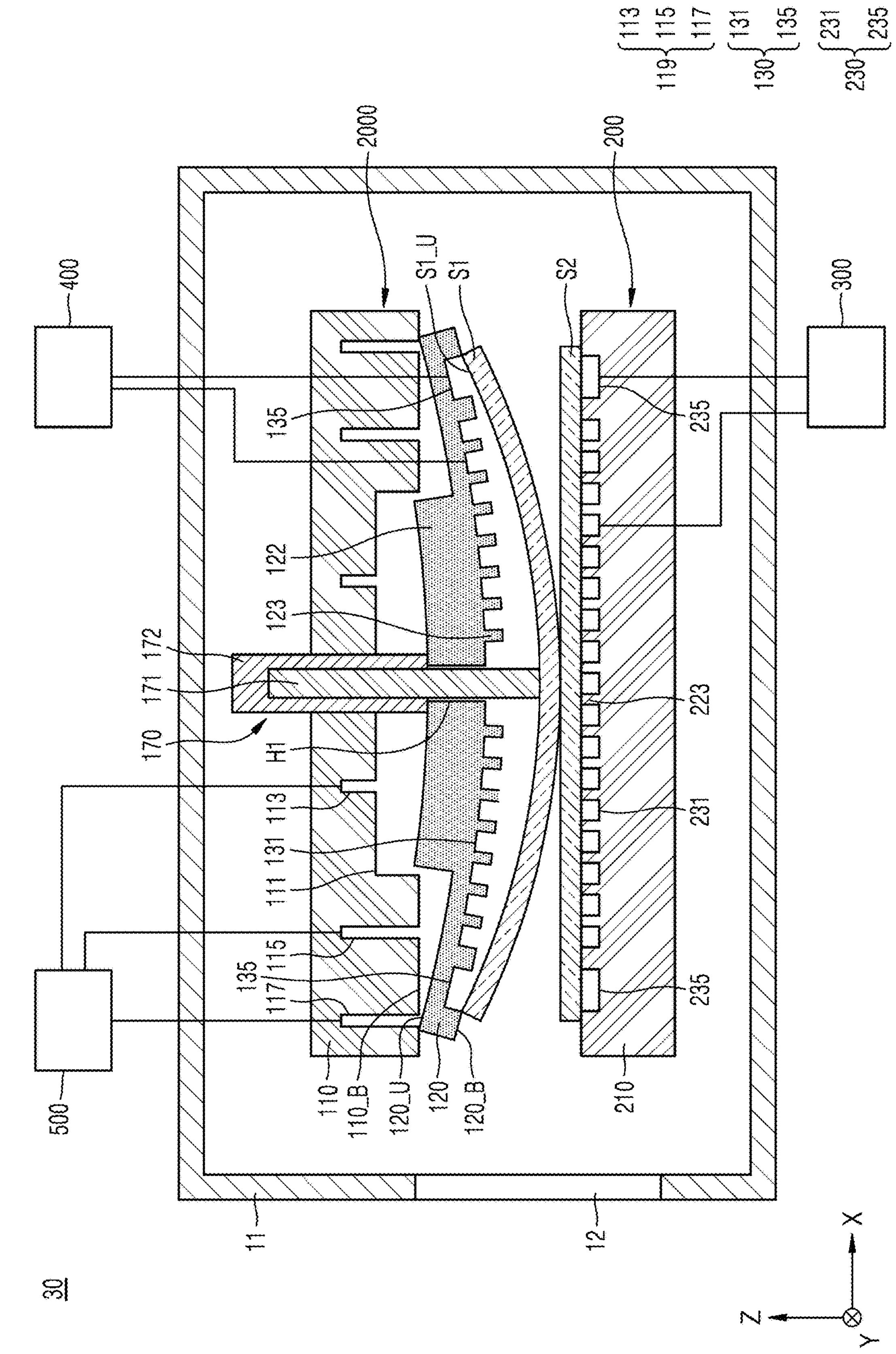

With reference to FIGS. 8 and 9C, after the first transformation plate 120 is transformed, the second rod 171 may press the first substrate S1 and transform the first substrate S1 into a convex shape (S141).

After the adsorptive power of the plurality of first vacuum grooves 130 located at the central area of the first transformation plate 120 is released, the second rod 171 may physically press one surface S1_U of the first substrate S1 to transform the first substrate S1. That is, the adsorption of the first transformation plate 120 and the first substrate S1 may be released in the central area of the first substrate S1, and by the second rod 171 pressing the center of the first substrate S1, the first substrate S1 may be transformed into a convex shape.

Although FIG. 9C illustrates the example of physically pressing the center of the first substrate S1 by the second rod 171 to transform the first substrate S1, the method of transforming the first substrate S1 is not limited thereto. For example, the first substrate S1 may be transformed by air pressure.

Figure 9D:
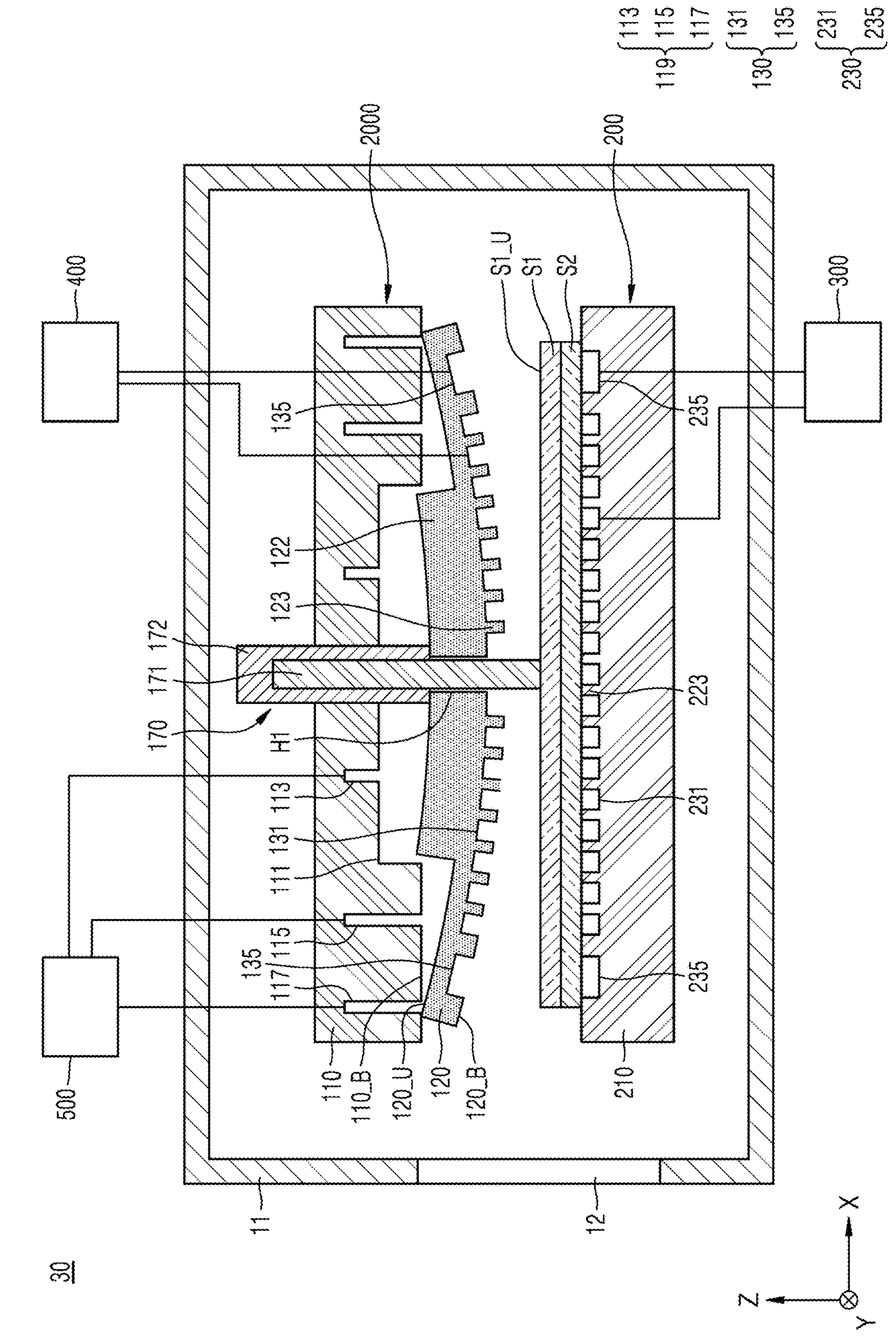

With reference to FIGS. 8 and 9D, after the first substrate S1 is transformed, the adsorptive power to the central area of the first bonding chuck 100 may be released to initiate the bonding between the first substrate S1 and the second substrate S2 (S142). After the first substrate S1 and the second substrate S2 are bonded at the bonding initiation point, the bonding area between the first substrate S1 and the second substrate S2 may be spread from the bonding initiation point towards the edge area (S150).

The initiation of substrate bonding and spread of substrate bonding may be substantially the same as the initiation of substrate bonding and spread of substrate bonding described with reference to FIGS. 2A to 2D.

Next, when the bonding between the edge area of the first substrate S1 and the edge area of the second substrate S2 is completed, the first bonding surface of the first substrate S1 and the second bonding surface of the second substrate S2 may be bonded together to form a bonded substrate BS. When the bonding of the first substrate S1 and the second substrate S2 is completed, the bonded substrate BS may be unloaded from the second bonding chuck 200 (S160).

Figure 10:
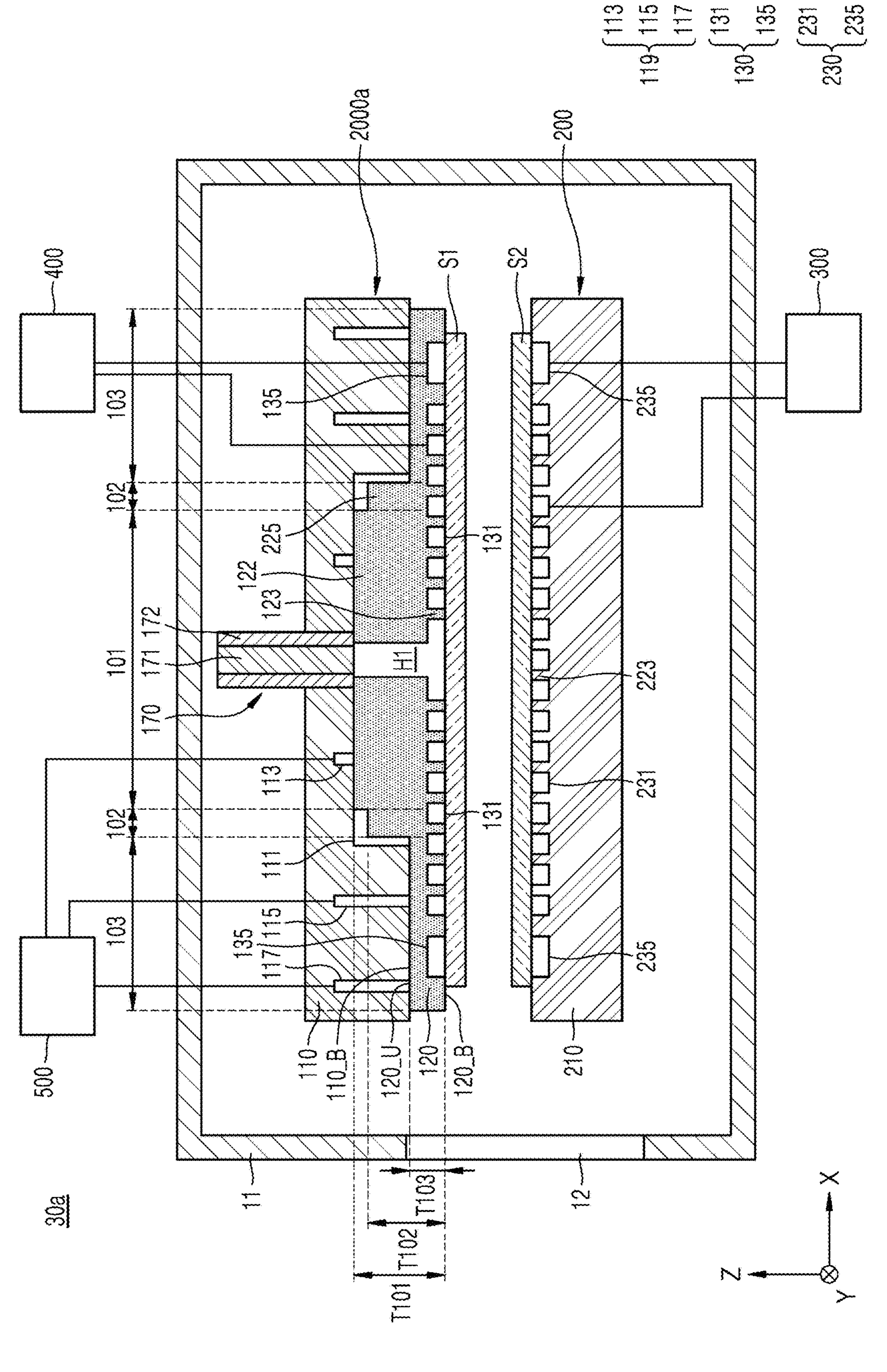
FIG. 10 is a schematic cross-sectional diagram of a substrate bonding apparatus according to some embodiments.

FIG. 10 is a schematic cross-sectional diagram of a substrate bonding apparatus according to some embodiments.

With reference to FIG. 10, a substrate bonding apparatus 30*a* may include a chamber 11, a first bonding chuck 2000*a*, and a second bonding chuck 200.

Hereinafter, differences between the substrate bonding apparatus 30*a* of FIG. 10 and the substrate bonding apparatus 30 of FIG. 9A are described, and any redundant description thereon will be omitted.

The first bonding chuck 2000*a* of the substrate bonding apparatus 30*a* may include the first transformation plate 120. The first transformation plate 120 may include a plurality of areas having different heights from each other. Hereinafter, the example of the first transformation plate 120 including three areas having different heights from each other is described; however, the number of areas having different heights is not limited thereto.

The first transformation plate 120 may include a first area 101, a second area 102, and a third area 103. The first area 101 may include the central point of the first surface 120_U of the first transformation plate 120. The third area 103 may include an end of the first transformation plate 120. The second area 102 may be located between the first area 101 and the third area 103. In other words, the first area 101, the second area 102, and the third area 103 may be sequentially arranged away from the center of the first surface 120_U of the first transformation plate 120.

The thickness of the first transformation plate 120 may be greater in the first area 101 than in the second area 102. The thickness of the first transformation plate 120 may be greater in the second area 102 than in the third area 103. In other words, when the first transformation plate 120 has a first length T101 in the first area 101, a second length T102 in the second area 102, and a third length T103 in the third area 103, the first length T101 may be greater than the second length T102, and the second length T102 may be greater than the third length T103.

In some embodiments, the thickness of the first transformation plate 120 may decrease from the first area 101 of the first transformation plate 120 towards the third area 103. That is, the thickness of the first transformation plate 120 may decrease towards the end of the first transformation plate 120. For example, the thickness of the first transformation plate 120 may gradually decrease from the center of the first transformation plate 120 to the edge.

Figure 11:
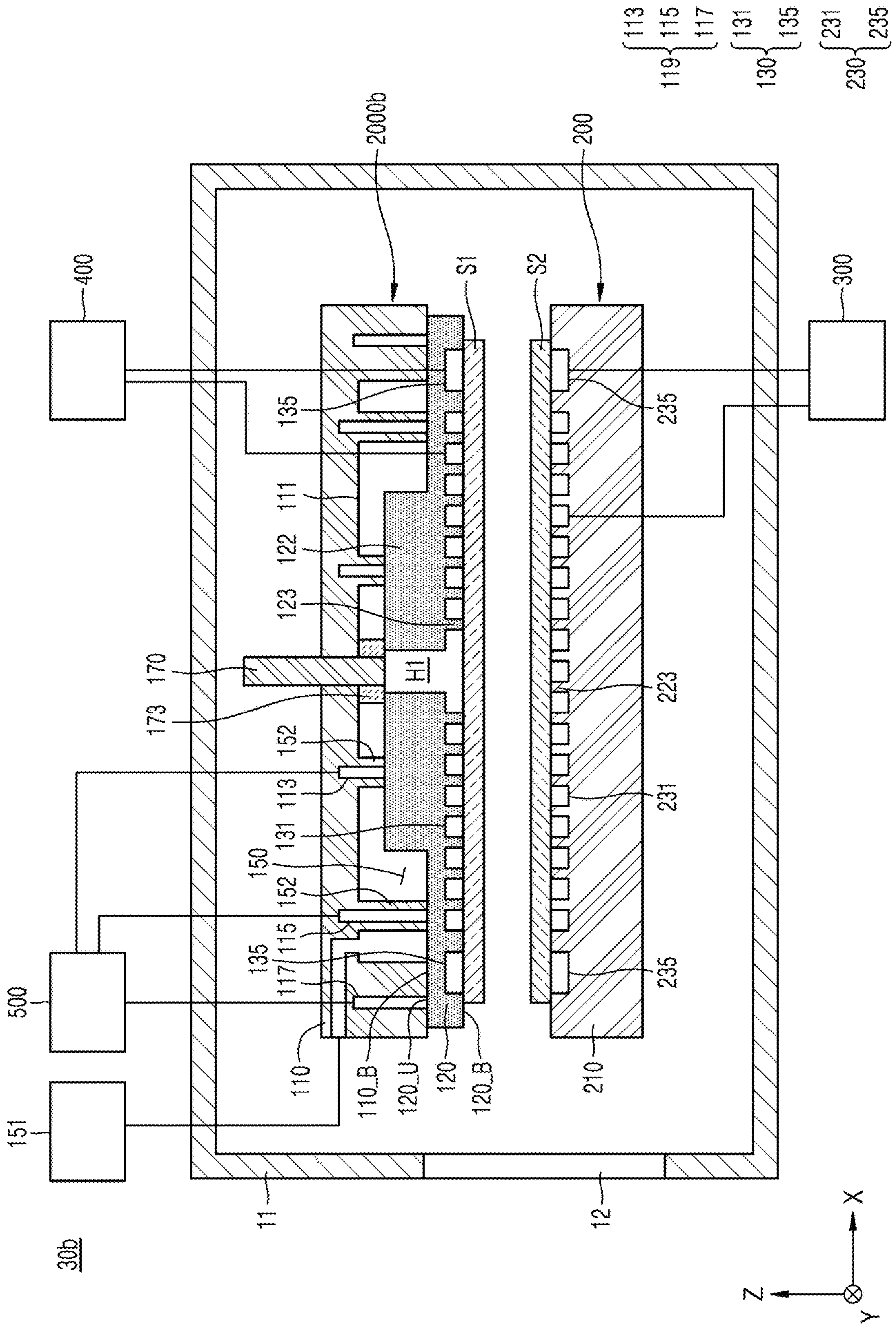
FIG. 11 is a schematic cross-sectional diagram of a substrate bonding apparatus according to some embodiments.

FIG. 11 is a schematic cross-sectional diagram of a substrate bonding apparatus according to some embodiments.

With reference to FIG. 11, a substrate bonding apparatus 30*b* may include a chamber 11, a first bonding chuck 2000*b*, and a second bonding chuck 200.

The substrate bonding apparatus 30*b* of FIG. 11 is different from the substrate bonding apparatus 30 of FIG. 9A in the method of transforming the first transformation plate 120 but other aspects may be substantially the same.

Hereinafter, differences between the substrate bonding apparatus 30*b* of FIG. 11 and the substrate bonding apparatus 30 of FIG. 9A are described, and any redundant description thereon will be omitted.

The first bonding chuck 2000*b* of the substrate bonding apparatus 30*b* may include a first base 110, a first transformation plate 120, a sealer 173, and an air pressure regulator 151.

In some embodiments, the first transformation plate 120 may be the first transformation plate (120 of FIG. 2A and 120*c* of FIG. 3) described above.

In some embodiments, the second bonding chuck 200 may be the second bonding chuck (200 of FIG. 2A and 200*a* of FIG. 5A) described above.

The air pressure regulator 151 may regulate the air pressure of a cavity 150 formed between the first base 110 and the first transformation plate 120 to transform the first transformation plate 120. For example, an air flow hole connected to the air pressure regulator 151 and communicating with the cavity 150 may be formed on the first base 110, and the air pressure regulator 151 may inject or discharge air into or from the cavity 150 through the air flow hole formed in the first base 110.

For example, the air pressure regulator 151 may inject air into the cavity 150 to increase pressure of the cavity 150 or discharge air from the cavity 150 to decrease the pressure of the cavity 150.

By adjusting the pressure of the cavity 150, the air pressure regulator 151 may adjust the distance between the first transformation plate 120 and the first base 110 and adjust the curvature of the first substrate S1.

The sealer 173 may be arranged between the first transformation plate 120 and the first base 110 to limit and/or prevent inflow of outside air into the cavity 150. The sealer 173 may separate the through hole H1 of the first transformation plate 120 accommodating the pressure rod 170 from the cavity 150.

The sealer 173 may have a cylindrical shape, and may include a path through which the pressure rod 170 may pass. One end of the sealer 173 may be fixed to the first base 110 and the other end of the sealer 173 may be fixed to the first transformation plate 120. During the transformation of the first transformation plate 120, the sealer 173 may be contracted or extended in the vertical direction.

Figure 12:
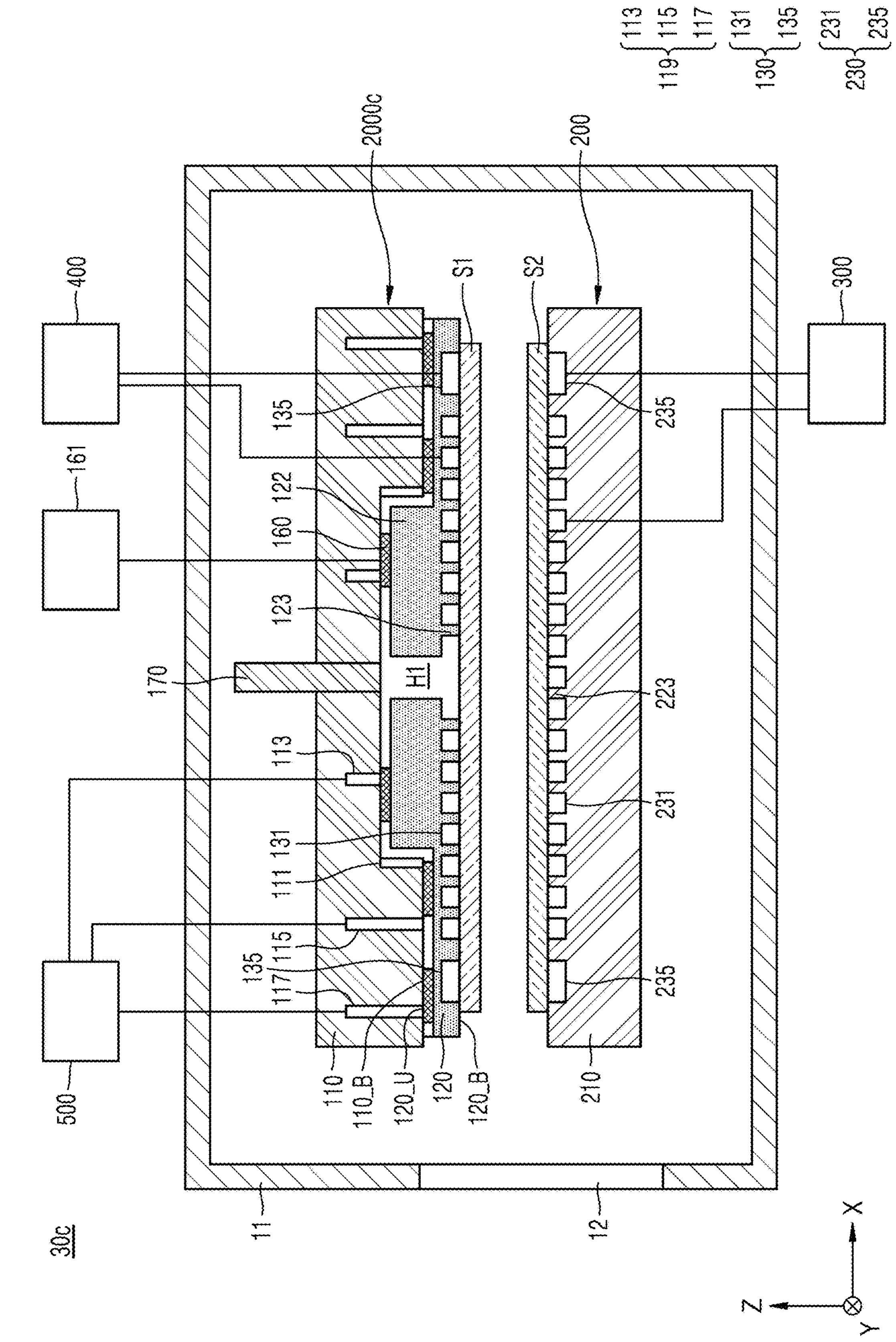
FIG. 12 is a schematic cross-sectional diagram of a substrate bonding apparatus according to some embodiments.

FIG. 12 is a schematic cross-sectional diagram of a substrate bonding apparatus according to some embodiments.

With reference to FIG. 12, a substrate bonding apparatus 30*c* may include a chamber 11, a first bonding chuck 2000*c*, and a second bonding chuck 200.

The substrate bonding apparatus 30*c* of FIG. 12 is different from the substrate bonding apparatus 30 of FIG. 9A in the method of transforming the first transformation plate 120 but other aspects may be substantially the same.

Hereinafter, differences between the substrate bonding apparatus 30*c* of FIG. 12 and the substrate bonding apparatus 30 of FIG. 9A are described, and any redundant description thereon will be omitted.

The first bonding chuck 2000*c* of the substrate bonding apparatus 30*c* may include a first base 110, a first transformation plate 120, and a piezoelectric sheet 160. In some embodiments, the substrate bonding apparatus 30*c* may further include a power supply 161 supplying power to the piezoelectric sheet 160.

The piezoelectric sheet 160 of the first bonding chuck 2000*c* may be located on the first surface 120_U of the first transformation plate 120.

When power is applied to the piezoelectric sheet 160, by the piezoelectric effect, a part of the piezoelectric sheet 160 to which power is applied may be transformed locally. For example, by the power applied from the outside, the piezoelectric sheet 160 may locally contract or expand. Such local transformation of the piezoelectric sheet 160 may cause local transformation of the first transformation plate 120.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to embodiments thereof, it will be understood that various changes in form and details may be made therein without departing from the spirit and scope of the following claims.

What is claimed is:

1. A substrate bonding apparatus comprising:
a first bonding chuck configured to support a first substrate, the first bonding chuck including a first base and a first transformation plate; and
a second bonding chuck configured to support a second substrate, the second bonding chuck including a second base facing the first bonding chuck, wherein
the first base includes a recess groove,
the recess groove is recessed inward from a surface of the first base on which the first transformation plate is mounted,
the first transformation plate includes a first protrusion protruding outward from a first surface of the first transformation plate,
a second surface of the first transformation plate is opposite the first surface of the first transformation plate,
the second surface of the first transformation plate is configured to support the first substrate, and
the first transformation plate is mounted on the first base in a manner allowing a distance between the first transformation plate and the first base to vary.

2. The substrate bonding apparatus of claim 1, wherein a part of the first protrusion is in the recess groove.

3. The substrate bonding apparatus of claim 1, wherein
the first protrusion is in a central area of the first transformation plate, and
the central area of the first transformation plate is an area having a radius of 80 nm to 120 nm in a first direction from a center point in the first direction of the first surface of the first transformation plate, and
the first direction corresponds to a width of the first transformation plate.

4. The substrate bonding apparatus of claim 1, wherein
a thickness of an area including the first protrusion of the first transformation plate is greater than a thickness of other areas of the first transformation plate by 1 mm to 2 mm.

5. The substrate bonding apparatus of claim 1, wherein
the first bonding chuck comprises a plurality of vacuum lines, and
the plurality of vacuum lines are located on the surface of the first base on which the first transformation plate is mounted,
the plurality of vacuum lines are configured to provide adsorptive power to the first transformation plate for mounting the first transformation plate onto the first base.

6. The substrate bonding apparatus of claim 5, wherein at least some of the plurality of vacuum lines are on the recess groove.

7. The substrate bonding apparatus of claim 1, wherein
the first bonding chuck comprises a plurality of first vacuum grooves configured to provide adsorptive power to adsorb the first substrate onto the first transformation plate, and
the plurality of first vacuum grooves are in the second surface of the first transformation plate.

8. The substrate bonding apparatus of claim 7, wherein
the plurality of first vacuum grooves comprise an inner vacuum groove and an edge vacuum groove,
the inner vacuum groove is in a central area of the second surface of the first transformation plate in a first direction corresponding to a width of the first transformation plate,
the edge vacuum groove is in an edge area of the second surface of the first transformation plate in the first direction, and
the substrate bonding apparatus is configured to adjust an adsorptive power applied to the inner vacuum groove and an adsorptive power applied to the edge vacuum groove independently from each other.

9. The substrate bonding apparatus of claim 8, wherein,
the substrate bonding apparatus is configured to release the adsorptive power applied to the inner vacuum groove and the edge vacuum groove in order from the inner vacuum groove to the edge vacuum groove, respectively, during a spread of a bonding area between a central area of the first substrate and a central area of the second substrate.

10. The substrate bonding apparatus of claim 8, wherein
the inner vacuum groove has a circular shape, and
the edge vacuum groove surrounds the inner vacuum groove and has a ring shape.

11. The substrate bonding apparatus of claim 8, wherein
the first bonding chuck comprises a plurality of dimples, and
the plurality of dimples are inside the inner vacuum groove and configured to contact the first substrate.

12. The substrate bonding apparatus of claim 11, wherein
the plurality of dimples are apart from each other, and
a distance between the plurality of dimples is less than a width of the edge vacuum groove.

13. The substrate bonding apparatus of claim 7, wherein
the second bonding chuck comprises a plurality of second vacuum grooves configured to provide adsorptive power to adsorb the second substrate onto the second base, and
the plurality of second vacuum grooves are in a surface of the second base facing the first bonding chuck.

14. The substrate bonding apparatus of claim 13, wherein
the substrate bonding apparatus is configured to align the plurality of first vacuum grooves and the plurality of second vacuum grooves with each other during a spread of bonding between the first substrate and the second substrate.

15. The substrate bonding apparatus of claim 1, wherein
the second bonding chuck comprises a second transformation plate,
the second transformation plate comprises a first surface configured to support the second substrate and a second surface opposite the first surface, and
the second surface of the second transformation plate is mounted onto the second base in a manner allowing a distance between the second transformation plate and the second base to vary.

16. A substrate bonding apparatus comprising:

a first bonding chuck configured to support a first substrate, the first bonding chuck including a first base, a first transformation plate, and a pressure rod; and a second bonding chuck facing the first bonding chuck, the second bonding chuck configured to support a second substrate, wherein the first base includes a recess groove, the recess groove is recessed inward from a surface of the first base, the first transformation plate is mounted on the surface of the first base, the first transformation plate includes a first surface in contact with the first base in a manner allowing a distance between the first transformation plate and the first base to vary, a second surface of the first transformation plate is opposite the first surface of the first transformation plate, the second surface of the first transformation plate is configured to support the first substrate, a center of the first transformation plate includes a through hole extending from the first surface of the first transformation plate to the second surface of the first transformation plate, the pressure rod is mounted on the first base and configured to move in a vertical direction through the through hole of the first base and physically press and transform the first substrate when the first substrate is on the second surface of the first transformation plate, and the first transformation plate includes a plurality of areas having different thicknesses from each other.

17. The substrate bonding apparatus of claim 16, wherein the first transformation plate comprises a first area and a second area, the second area surrounds the first area, a thickness of the first transformation plate in the first area is greater than a thickness of the first transformation plate in the second area, and the through hole is in the first area.

18. The substrate bonding apparatus of claim 16, wherein the first transformation plate comprises a first area, a second area, and a third area, a thickness of the first transformation plate in the first area is greater than a thickness of the first transformation plate in the second area, the thickness of the first transformation plate in the second area is greater than a thickness of the first transformation plate in the third area, the first area comprises a center point of the first surface of the first transformation plate, the third area comprises an end portion of the first transformation plate, the second area is between the first area and the third area, and the through hole is in the first area.

* * * * *